United States Patent
Ki et al.

(10) Patent No.: US 9,748,322 B2
(45) Date of Patent: Aug. 29, 2017

(54) FLEXIBLE DISPLAY DEVICE WITH DIVIDED POWER LINES AND MANUFACTURING METHOD FOR THE SAME

(71) Applicant: LG Display Co., Ltd., Seoul (KR)

(72) Inventors: Yunho Ki, Gumi-si (KR); SieHyug Choi, Goyang-si (KR); YoungMin Yu, Gumi-si (KR); Sungwoo Kim, Paju-si (KR); YoonDong Cho, Gwangmyeong-si (KR); SeYeoul Kwon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/136,630

(22) Filed: Apr. 22, 2016

(65) Prior Publication Data

US 2016/0240602 A1 Aug. 18, 2016

Related U.S. Application Data

(63) Continuation of application No. 14/503,260, filed on Sep. 30, 2014, now Pat. No. 9,349,758.

(51) Int. Cl.
*H01L 27/32* (2006.01)
*H01L 27/12* (2006.01)
*H01L 51/00* (2006.01)
*H01L 29/786* (2006.01)
*H01L 51/52* (2006.01)

(52) U.S. Cl.
CPC ...... *H01L 27/3276* (2013.01); *H01L 27/1218* (2013.01); *H01L 27/1222* (2013.01); *H01L 27/1225* (2013.01); *H01L 27/1244* (2013.01); *H01L 27/3297* (2013.01); *H01L 29/7869* (2013.01); *H01L 29/78672* (2013.01); *H01L 51/0097* (2013.01); *H01L 27/323* (2013.01); *H01L 51/524* (2013.01); *H01L 2251/5338* (2013.01); *Y02E 10/549* (2013.01)

(58) Field of Classification Search
CPC .............. H01L 27/1218; H01L 27/124; H01L 27/1244; H01L 27/1259; H01L 27/326; H01L 27/56
See application file for complete search history.

(56) References Cited

U.S. PATENT DOCUMENTS

| 9,491,855 B2 * | 11/2016 | Lee ........................ H05K 1/028 |
| 2009/0256825 A1 * | 10/2009 | Klinghult .............. G06F 3/0412 345/179 |

(Continued)

FOREIGN PATENT DOCUMENTS

| KR | 10-2014-0025931 A | 3/2014 |
| KR | 10-2014-0085956 A | 7/2014 |

OTHER PUBLICATIONS

PCT International Search Report and Written Opinion for PCT/KR2015/009299, Dec. 17, 2015, 11 Pages.

(Continued)

*Primary Examiner* — Kyoung Lee
*Assistant Examiner* — Christina Sylvia
(74) *Attorney, Agent, or Firm* — Fenwick & West LLP

(57) ABSTRACT

There is provided a flexible display having a plurality of innovations configured to allow bending of a portion or portions to reduce apparent border size and/or utilize the side surface of an assembled flexible display.

17 Claims, 20 Drawing Sheets

(56) References Cited

U.S. PATENT DOCUMENTS

| | | |
|---|---|---|
| 2014/0055429 A1 | 2/2014 | Kwon et al. |
| 2014/0138637 A1 | 5/2014 | Yang et al. |
| 2014/0183473 A1* | 7/2014 | Lee .................... H01L 51/0097 257/40 |
| 2014/0217373 A1* | 8/2014 | Youn .................. H01L 23/4985 257/40 |
| 2014/0217397 A1 | 8/2014 | Kwak et al. |
| 2014/0232956 A1 | 8/2014 | Kwon et al. |
| 2015/0382446 A1* | 12/2015 | Kwon .................... H05K 1/028 174/251 |

OTHER PUBLICATIONS

Office Action for U.S. Appl. No. 14/503,260, Oct. 21, 2015, 7 Pages.

* cited by examiner

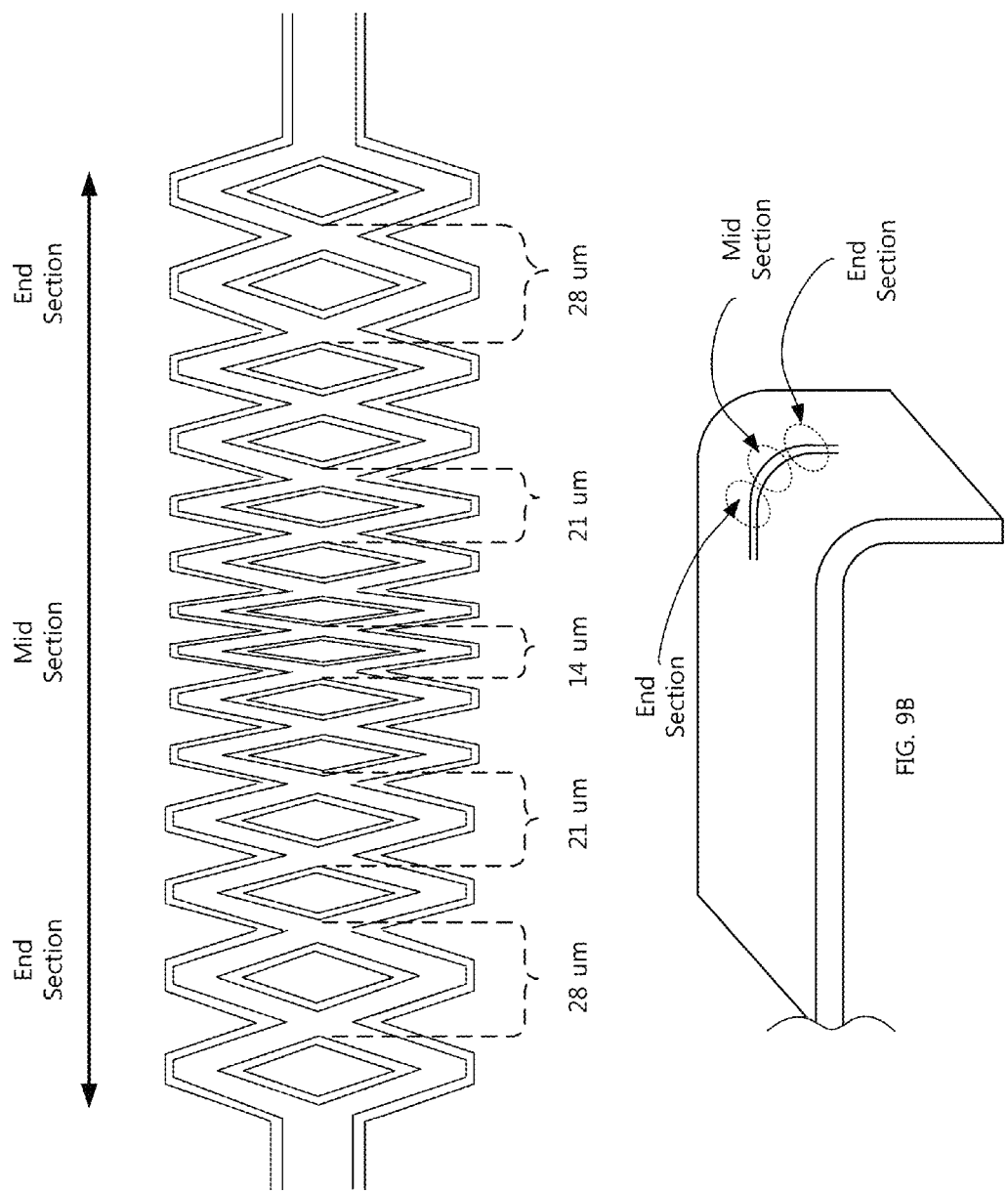

FLEXIBLE DISPLAY DEVICE WITH DIVIDED POWER LINES AND MANUFACTURING METHOD FOR THE SAME

CROSS-REFERENCE TO RELATED APPLICATION

This application is a continuation application of a co-pending U.S. patent application Ser. No. 14/503,260 filed on Sep. 30, 2014, which is incorporated by reference herein in its entirety.

BACKGROUND

Technical Field

This relates generally to electronic devices, and more particularly, to electronic devices with a display.

Description of the Related Art

Electronic devices often include displays. For example, cellular telephones and portable computers include displays for presenting information to a user. Components for the electronic device, including but not limited to a display, may be mounted in the housing made of plastic or metal.

An assembled display may include a display panel and a number of components for providing a variety of functionalities. For instance, one or more display driving circuits for controlling the display panel may be included in a display assembly. Examples of the driving circuits include gate drivers, emission (source) drivers, power (VDD) routing, electrostatic discharge (ESD) circuits, multiplex (mux) circuits, data signal lines, cathode contacts, and other functional elements. There may be a number of peripheral circuits included in the display assembly for providing various kinds of extra functions, such as touch sense or fingerprint identification functionalities.

Some of the components may be disposed on the display panel itself, often in the areas peripheral to the display area, which is referred in the present disclosure as the non-display area and/or the inactive area. When such components are provided in the display panel, they populate a significant portion of the display panel. Large inactive area tends to make the display panel bulky, making it difficult to incorporate it into the housing of electronic devices. Large inactive area may also require a significant portion of the display panel to be covered by overly large masking (e.g., bezel, borders, covering material), leading to unappealing device aesthetics.

Size and weight are of the critical importance in designing modern electronic devices. Also, a high ratio of the active area size compared to that of inactive area, which is sometimes referred to as the screen to bezel ratio, is one of the most desired feature. There is a limit as to how much reduction in the size of the inactive area for higher screen-to-bezel ratio can be realized from mere use of a separate flexible printed circuit (FPC) for connecting components to the display panel. Space requirement for reliably attaching signal cables and to fan out wires along the edges of the display panel still needs to be disposed in the inactive area of the display panel.

It will be highly desirable to bend the base substrate where the active with the pixels and the inactive area are formed thereon. This would truly minimize the inactive area of the display panel that needs to be hidden under the masking or the device housing. Not only does the bending of the base substrate will minimize the inactive area size need to be hidden from view, but it will also open possibility to various new display device designs.

However, there are various new challenges that need to be solved in providing such flexible displays. The components formed directly on the base substrate along with the display pixels tend to have tremendously small dimension with unforgiving margin of errors. Further, these components need to be formed on extremely thin sheet to provide flexibility, making those components extremely fragile to various mechanical and environmental stresses instigated during the manufacture and/or in the use of the displays.

Further complication arises from the fact that the components fabricated directly on the base substrate with the display pixels are often closely linked to the operation of those pixels. If care is not taken, the mechanical stresses from bending of the flexible display can negatively affect the reliability or even result in complete component failure. Even a micro-scale defect in the component thereof can have devastating effects on the performance and/or reliability of the display pixels amounting to scrap the entire display panel without an option to repair.

For instance, a few micrometer scale cracks in the electric wires can cause various abnormal display issues and may even pixels in several rows or sections of the display panel not to be activated at all. As such, various special parameters must be taken in consideration when designing electrical wiring schemes to be fabricated on the flexible base substrate along with the display pixels. Simply increasing the bending radius may make it difficult to garner any significant benefits in flexing the base substrate of the display panel. It would therefore be desirable to provide a flexible display that can operate reliably even under the bending stresses from extreme bending radius.

BRIEF SUMMARY

An aspect of the present disclosure is related to a flexible display, which includes configurations for wire traces to withstand bending stress for reliable operation of the flexible display.

In one embodiment, a display apparatus includes a base layer where an array of pixel circuits and a driving circuit are disposed on. Among a plurality of conductive line traces connected to the array of pixel circuits or a driving circuit, at least one of the conductive line traces is provided with a portion applied with a strain-reducing trace design. The conductive line trace portion with the strain reducing trace design is located on a part of the base layer corresponding to a bend portion of the display apparatus, where the base layer is curved. Around the conductive line trace portion having the strain reducing trace design, one or more inorganic insulation layers disposed under and/or on the conductive line trace are patterned around the portion of the conductive line trace having the strain reducing trace design.

The conductive line trace portion having the strain reducing trace design includes an elongated recessed channel between a first grid part and a second grid part, which are in contact with each other. Each of the first grid part and the second grid part has a plurality of diamond-chain conductive line traces that are arranged side-by-side and in contact to each other.

Since the reduced number of diamond-chain traces adjoined in each part can reduce the viscid drag of the micro-coating layer. More importantly, the elongated recessed channel between the grid parts of the wire trace improves the wettability of the micro-coating layer and reduce the viscid drag of the micro-coating layer. Accordingly, increase in the maximum spread diameter of the micro-coating layer can be achieved by positioning one or more rails within the wire having the grid-like strain-reducing trace design.

In another embodiment, a display apparatus includes a first portion, a second portion and a bend allowance section between the first portion and the second portion of the display apparatus. In the first portion of the display apparatus a plurality of organic light-emitting diode (OLED) elements is disposed. In the bend allowance section, a power supplying conductive line trace of the display apparatus is disposed. The power supplying conductive line trace includes at least two stripes of grids, which are spaced apart by an elongated recessed channel. In the bend allowance section, a micro-coating layer is disposed over the power supplying conductive line trace.

The elongated recessed channel between the grid parts of the wire trace improves the wettability of the micro-coating layer and reduce the viscid drag of the micro-coating layer. This allows to reduce formation of unwanted exposed area that is not covered by the micro-coating layer.

BRIEF DESCRIPTION OF THE DRAWINGS

FIGS. 9A-9C illustrate schematic view of an exemplary strain-reducing wire trace design having a plurality of sub-traces that split and merge at a certain interval according to embodiments of the present disclosure.

DETAILED DESCRIPTION

Flexible Display

Figure 1:
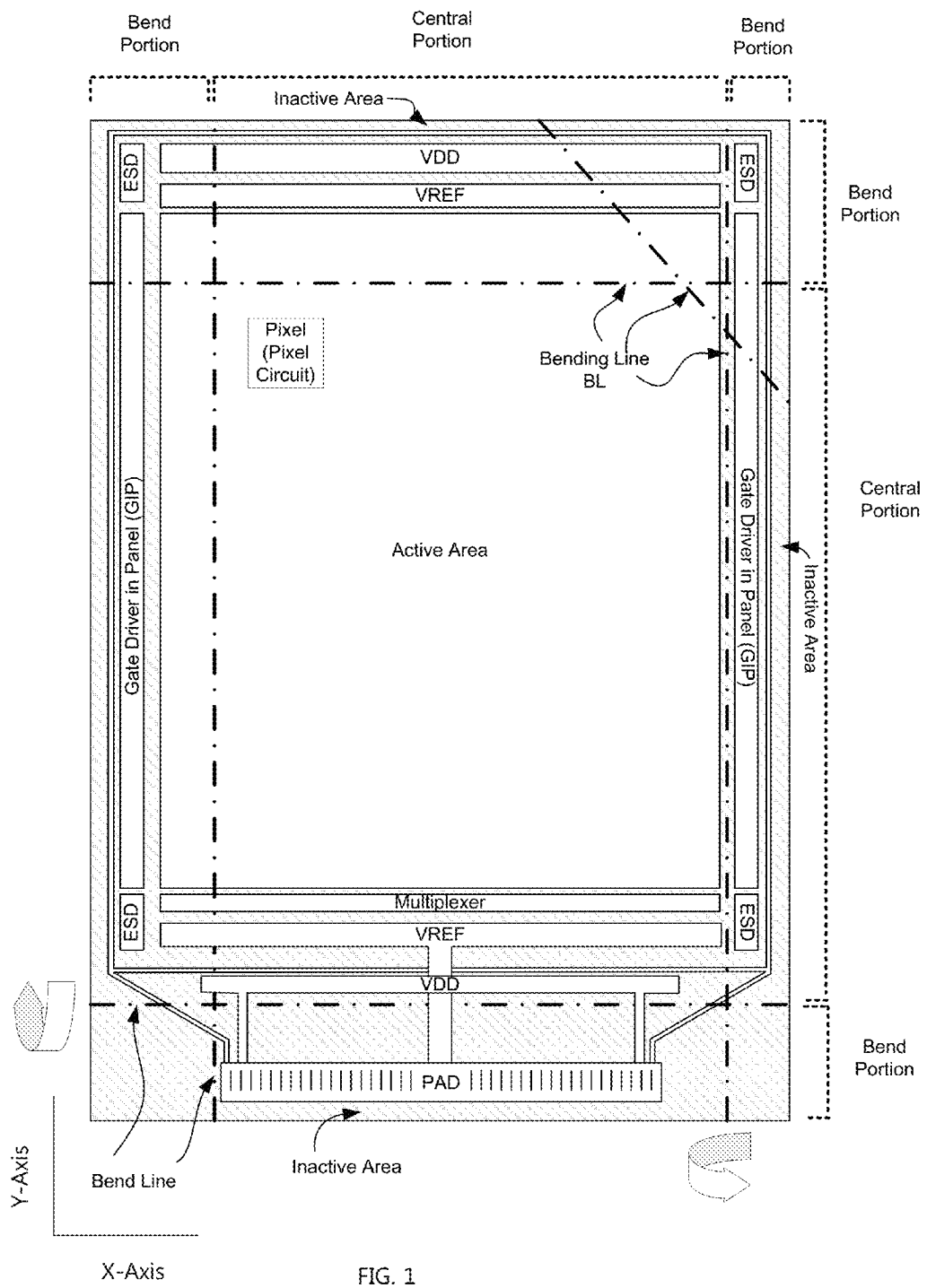
FIG. 1 illustrates schematic view of an exemplary display apparatus according to embodiments of the present disclosure.

FIG. 1 illustrate exemplary flexible display 100 which may be incorporated in electronic devices. Referring to FIG. 1, the flexible display 100 includes at least one active area (i.e., display area), in which an array of display pixels are formed therein. One or more inactive areas may be provided at the periphery of the active area. That is, the inactive area may be adjacent to one or more sides of the active area. In FIG. 1, the inactive area surrounds a rectangular shape active area. However, it should be appreciated that the shapes of the active area and the arrangement of the inactive area adjacent to the active area are not particularly limited as the exemplary flexible display 100 illustrated in FIG. 1. The active area and the inactive area may be in any shape suitable to the design of the electronic device employing the flexible display 100. Non-limiting examples of the active area shapes in the flexible display 100 include a pentagonal shape, a hexagonal shape, a circular shape, an oval shape, and more.

Each pixel in the active area may be associated with a pixel circuit, which includes at least one switching thin-film transistor (TFT) and at least one driving TFT on the backplane of the flexible display 100. Each pixel circuit may be electrically connected to a gate line and a data line to communicate with the driving circuits, such as a gate driver and a data driver, which are positioned in the inactive area of the flexible display 100.

For example, one or more driving circuits may be implemented with TFTs fabricated in the inactive area as depicted in FIG. 1. Such gate drivers may be referred to as a gate-in-panel (GIP). Also, some of the components, such as data drive-IC, may be mounted on a separate printed circuit and coupled to a connection interface (Pads/Bumps) disposed in the inactive area using a printed circuit film such as flexible printed circuit board (FPCB), chip-on-film (COF), tape-carrier-package (TCP) or any other suitable technologies. As will be described in further detail below, the inactive area with the connection interface can be bent away from the central portion so that the printed circuit film, such as the COF, FPCB and the like, is positioned at the rear side of the flexible display 100 to reduce the size of the inactive area to be hidden by a bezel.

The flexible display 100 may include various additional components for generating a variety of signals or otherwise operating the pixels in the active area. For example, an inverter circuit, a multiplexer, an electro static discharge (ESD) circuit and the like may be placed in the inactive area of the flexible display 100. The flexible display 100 may also include components associated with functionalities other than for operating the pixels of the flexible display 100. For instance, the flexible display 100 may include components for providing a touch sensing functionality, a user authentication functionality (e.g., finger print scan), a multi-level pressure sensing functionality, a tactile feedback functionality and/or various other functionalities for the electronic device employing the flexible display 100. These components can be placed in the inactive area or provided on a separate printed circuit that is connected to the connection interface of the flexible display 100.

Flat/Bend Portions

Multiple parts of the flexible display 100 can be bent along the bend line BL. The bend line BL in the flexible display 100 may extend horizontally (e.g., X-axis shown in FIG. 1), vertically (e.g., Y-axis shown in FIG. 1) or even diagonally. Accordingly, the flexible display 100 can be bent in any combination of horizontal, vertical and/or diagonal directions based on the desired design of the flexible display 100.

As mentioned, one or more edges of the flexible display 100 can be bent away from the plane of the central portion along the bend line BL. Although the bend line BL is depicted as being located near the edges of the flexible display 100, it should be noted that the bend lines BL can extend across the central portion or extend diagonally at one or more corners of the flexible display 100. Such configurations would allow the flexible display 100 to provide a foldable display or a double-sided display having display pixels on both outer sides of a folded display.

With the ability to bend one or more portions of the flexible display 100, part of the flexible display 100 may be defined by a substantially flat portion and a bend portion. A part of the flexible display 100 may remain substantially flat is referred to as a substantially flat portion of the flexible display 100. A part of the flexible display 100 may be bent in a certain bend angle from the plane of an adjacent portion, and such portion is referred to as a bend portion of the flexible display 100. The bend portion includes a bend allowance section, which can be actively curved in a certain bend radius.

Figure 2:
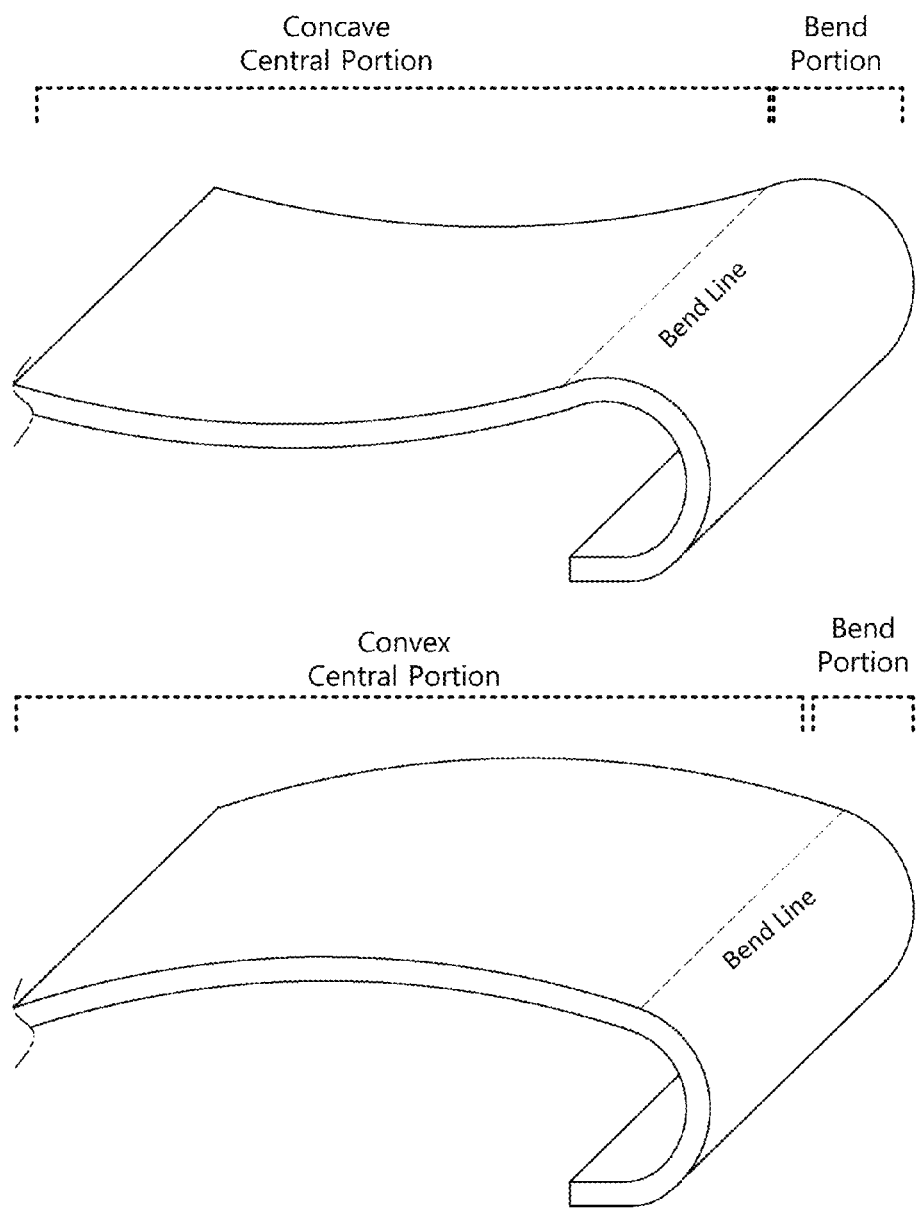
FIG. 2 illustrates exemplary arrangement of a substantially flat portion and bend portion of a display apparatus according to embodiments of the present disclosure.

It should be understood that the term "substantially flat" includes a portion that may not be perfectly flat. For example, the concave central portion and the convex central portion depicted in FIG. 2 may be described as a substantially flat portion in some embodiments discussed in the present disclosure. In FIG. 2, one or more bend portions exist next to the convex or concave central portion, and bent inwardly or outwardly along the bend line in a bend angle about a bend axis. The bend radius of the bend portion is smaller than the bend radius of the central portion. In other words, the term "substantially flat portion" refers to a portion with a lesser curvature than that of an adjacent bend allowance section of the flexible display 100.

Depending on the location of the bend line BL in the flexible display 100, a portion on one side of the bend line may be positioned toward the center of the flexible display 100, whereas the portion on the opposite side of the bend line BL is positioned toward an edge portion of the flexible display 100. The portion toward the center may be referred to as the central portion and the portion toward the edge may be referred to as the edge portion of the flexible display 100. Although this may not always be the case, a central portion of the flexible display 100 can be the substantially flat portion and the edge portion can be the bend portion of the flexible display 100. It should be noted that a substantially flat portion can also be provided in the edge portion of the flexible display 100. Further, in some configuration of the flexible display 100, two substantially flat portions can be connected by a bend allowance section in the middle.

As mentioned above, bending the inactive area allows to minimize or to eliminate the inactive area to be seen from the front side of the assembled flexible display 100. Part of the inactive area that remains visible from the front side can be covered with a bezel. The bezel may be formed, for example, from a stand-alone bezel structure that is mounted to the cover layer 114, a housing or other suitable components of the flexible display 100. The inactive area remaining visible from the front side may also be hidden under an opaque masking layer, such as black ink (e.g., a polymer filled with carbon black) or a layer of opaque metal. Such an opaque masking layer may be provided on a portion of various layers included in the flexible display 100, such as a touch sensor layer, a polarization layer, a cover layer, and other suitable layers.

Active Areas

In some embodiments, the bend portion of the flexible display 100 may include an active area capable of displaying image from the bend portion, which is referred herein after as the secondary active area. That is, the bend line BL can be positioned in the active area so that at least some display pixels of the active area is included in the bend portion of the flexible display 100.

Figure 3A:
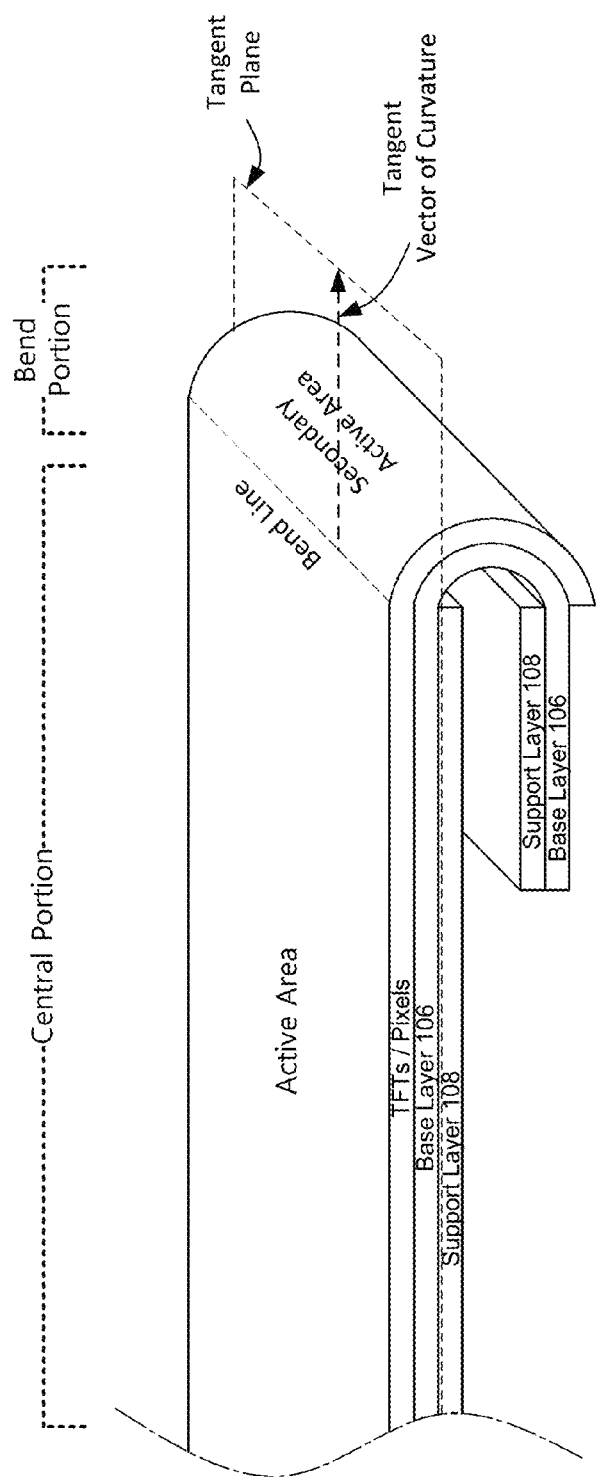
FIGS. 3A-3B illustrate exemplary arrangement of active areas of a display apparatus according to embodiments of the present disclosure.
Figure 3B:
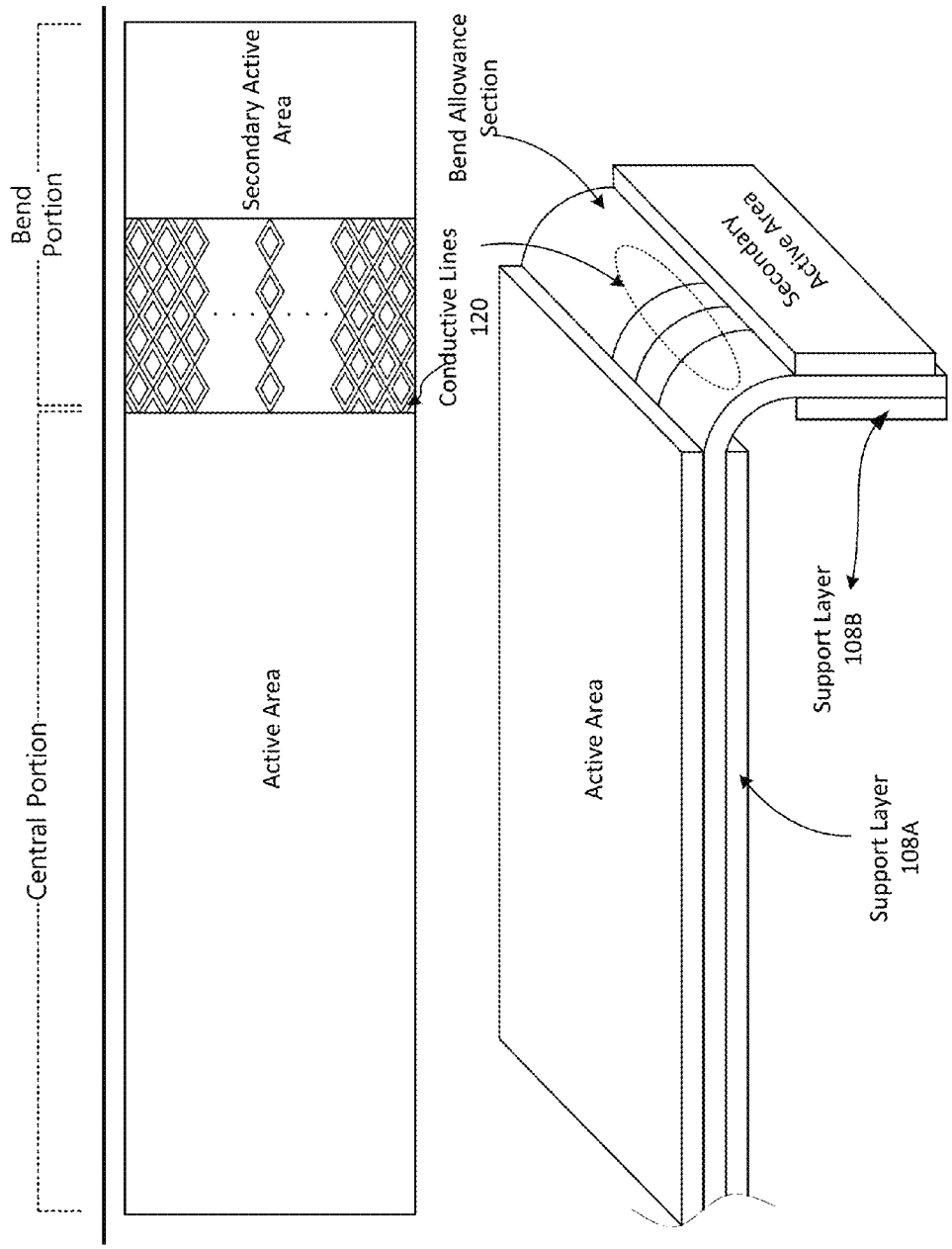

FIGS. 3A and 3B each illustrates an exemplary configuration of active areas in an embodiment of flexible display 100 of the present disclosure. In the configuration depicted in FIG. 3A, the matrix of pixels in the secondary active area of the bend portion may be continuously extended from the matrix of the pixels in the active area of the central portion. Alternatively, in the configuration depicted in FIG. 3B, the secondary active area within the bend portion and the active area within the central portion of the flexible display 100 may be separated apart from each other by the bend allowance section of the flexible display 100. Some components in the central portion and the bend portion can be electrically connected via one or more conductive line trace 120 laid across the bend allowance section of the flexible display 100.

The pixels in the secondary active area and the pixels in the central active area may be addressed by the driving circuits (e.g., gate driver, data driver, etc.) as if they are in a single matrix. In this case, the pixels of the central active area and the pixels of the secondary active area may be operated by the same set of driving circuits. By way of example, the $N^{th}$ row pixels of the central active area and the $N^{th}$ row pixels of the secondary active area may be configured to receive the gate signal from the same gate driver. As shown in FIG. 3B, the part of the gate line crossing over the bend allowance section (i.e., bend allowance region) or a bridge for connecting the gate lines of the two active areas may have a bend stress reduction design, which will be described in further detail below.

Depending on the functionality of the secondary active area, the pixels of the secondary active area can be driven discretely from the pixels in the central active area. That is, the pixels of the secondary active area may be recognized by the display driving circuits as being an independent matrix of pixels separate from the matrix of pixels in the central active area. In such cases, the pixels of the central active area and the pixels of the secondary active area may receive signals from at least one discrete driving circuit from the driving circuits employed by the central active area.

Regardless of the configuration, the secondary active area in the bend portion may serve as a secondary display area in the flexible display 100. Also, the size of the secondary active area is not particularly limited. The size of the secondary active area may depend on its functionality within the electronic device. For instance, the secondary active area may be used to provide images and/or texts such a graphical user interface, buttons, text messages, and the like. In some cases, the secondary active area may be used to provide light of various colors for various purposes (e.g., status indication light), and thus, the size of the secondary active area need not be as large as the active area in the central portion of the flexible display 100.

Stack-Up Structure

Figure 4:
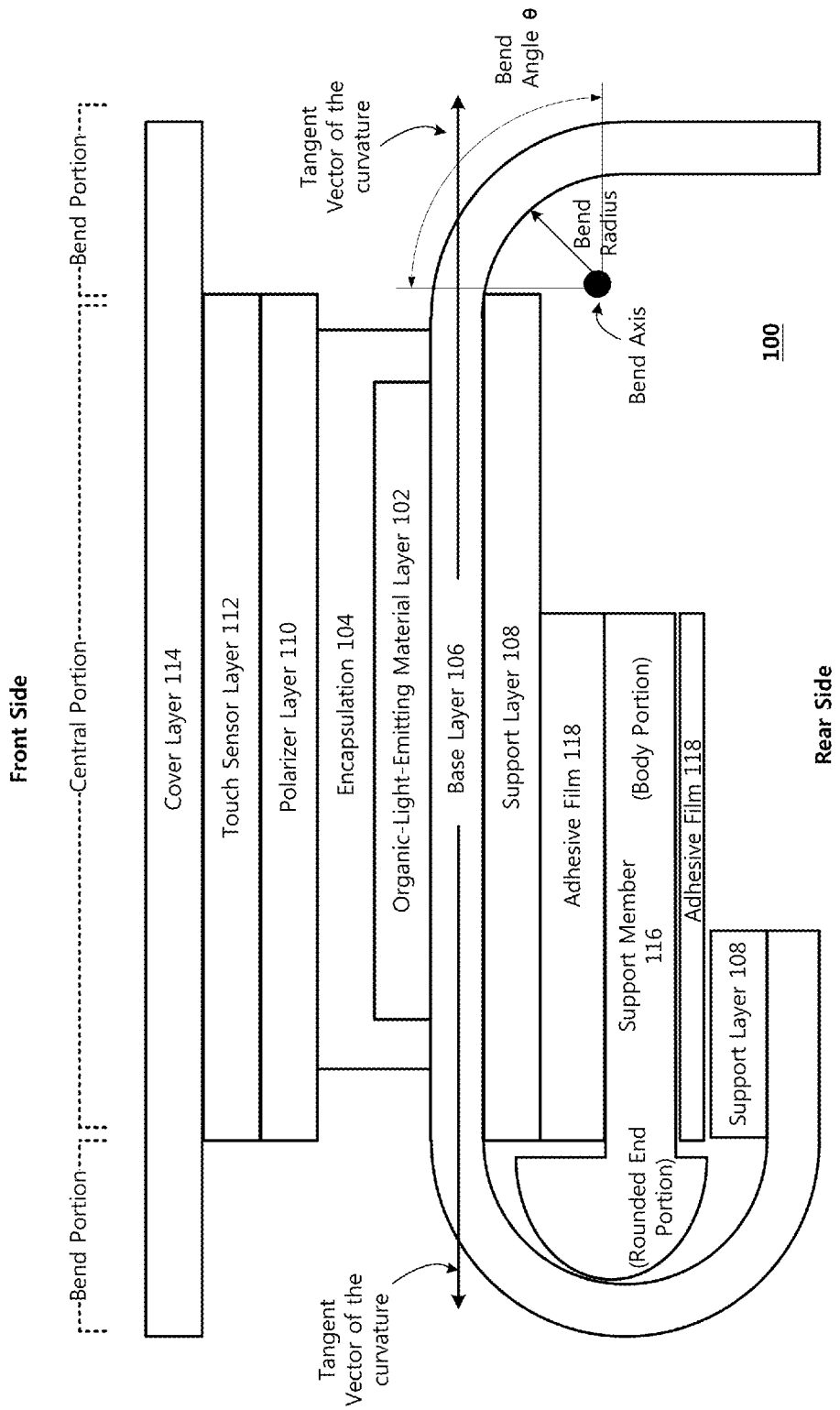
FIG. 4 illustrates simplified stack up structure of components in an exemplary display apparatus according to embodiment of the present disclosure.

FIG. 4 is a simplified cross-sectional view showing an exemplary stack up structure of a flexible display 100 in an embodiment of the present disclosure. For convenience of explanation, the central portion of the flexible display 100 is illustrated as being substantially flat and the bend portions of the flexible display 100 are positioned at the edges in FIG. 4.

As shown, one or more bend portions may be bent away from the plane of the substantially flat portion in a certain bend angle θ and with a bend radius R about the bending axis. The size of each bend portion that is bent away from the central portion needs not be the same. That is, the length of the base layer 106 from the bend line BL to the outer edge of the base layer 106 at each bend portion can be different from other bend portions. Also, the bend angle θ around the bend axis and the bend radius R from the bend axis can vary between the bend portions.

In the example shown in FIG. 4, the right side bend portion has the bend angle θ of 90°, and the bend portion includes a substantially flat section. The bend portion can be bent at a larger bend angle θ, such that at least some part of the bend portion comes underneath the plane of the central portion of the flexible display 100 as the bend portion on the left side of the flexible display 100. Also, a bend portion can be bent at a bend angle θ that is less than 90°.

In some embodiments, the radius of curvatures (i.e., bend radius) for the bend portions in the flexible display 100 may be between about 0.1 mm to about 10 mm, more preferably between about 0.1 mm to about 5 mm, more preferably between about 0.1 mm to about 1 mm, more preferably between about 0.1 mm to about 0.5 mm. The lowest bend radius of the bend portion of the flexible display 100 may be less than 0.5 mm.

One or more support layers 108 may be provided at the underside of the base layer 106 to increase rigidity at the selective portion of the flexible display 100. For instance, the support layer 108 can be provided on the inner surface of the base layer 106 at the substantially flat portions of the flexible display 100. The support layer 106 may also be provided on the base layer 106 of the bend portion that is positioned under the central portion of the flexible display 100. Increased rigidity at selective parts of the flexible display 100 may help in ensuring accurate configuration and placement of various components during manufacturing and using the flexible display 100. Further, the support layer 106 may not be provided in the bend allowance section where more flexibility is needed.

The base layer 106 and the support layer 108 may each be made of a thin plastic film formed from polyimide, polyethylene naphthalate (PEN), polyethylene terephthalate (PET), other suitable polymers, a combination of these polymers, etc. However, the support layer 108 can be more rigid than the base layer 106. Other suitable materials that may be used to form the base layer 106 and the support layer 108 include, a thin glass, a metal foil covered with a dielectric material, a multi-layered polymer stack and a polymer composite film comprising a polymer material combined with nanoparticles or micro-particles dispersed therein, etc. Support layers 108 provided in various parts of the flexible display 100 need not be made of the same material. For example, a thin-glass layer may be used as a support layer 108 for the central portion of the flexible display 100 while a thin plastic film layer is used as a support layer 108 for edge portions.

Excessively high thickness of the base layer 106 makes it difficult to be bent at an extremely small bending radius, which may desired at some bend portion of the flexible display 100. Excessively high thickness of the base layer 106 may also increase the mechanical stress to the components disposed thereon on the base layer 106. As such, the thickness of the base layer 106 may depend on the bend radius at the bend portion of the base layer 106. However, the base layer 106 with a thickness below a certain level may not be strong enough to reliably support various components disposed thereon.

Accordingly, the base layer 106 may have a thickness in a range of about from 5 μm to about 50 μm, more preferably in a range of about 5 μm to about 30 μm, and more preferably in a range of about 5 μm to about 16 μm. The support layer 108 may have a thickness from about 100 μm to about 125 μm, from about 50 μm to about 150 μm, from about 75 μm to 200 μm, less than 150 μm, or more than 100 μm. In one suitable exemplary configuration, the base layer 106 is formed from a layer of polyimide with a thickness of about 10 μm to about 16 μm and the support layer 108 is formed from polyethylene terephthalate (PET) with a thickness of about 100 μm to about 125 μm.

During manufacturing, some part of the flexible display 100 may be exposed to external light passing through the base layer 106. Some of the components or materials used in fabricating the components disposed on the base layer 106 may undergo undesirable state changes (e.g., threshold voltage shift in the TFTs) due to the light exposure during the manufacturing of the flexible display 100. Some parts of the flexible display 100 may be more heavily exposed to the external light than others, and this can lead to a display non-uniformity (e.g., mura, shadow defects, etc.). To minimize such problems, the base layer 106 and/or the support layer 108 may include one or more materials capable of reducing the amount of external light passing through in some embodiments of the flexible display 100.

By way of example, the light blocking material, for instance chloride modified carbon black, may be mixed in the constituent material of the base layer 106 (e.g., polyimide). In this way, the base layer 106 may formed of polyimide with a shade so that the base layer 106 can provides a light blocking functionality. Such a shaded base layer 106 can also improve the visibility of the image content displayed on the flexible display 100 by reducing the reflection of the external light coming in from the front side of the flexible display 100.

Instead of the base layer 106, the support layer 108 may include a light blocking material to reduce the amount of light coming in from the rear side (i.e., the support layer 108 attached side) of the flexible display 100. The constituent material of the support layer 108 may be mixed with one or more light blocking materials in the similar fashion as described above with the base layer 106. Further, both the base layer 106 and the support layer 108 can include one or more light blocking materials. Here, the light blocking materials used in the base layer 106 and the support layer 108 need not be the same.

While making the base layer 106 and the support layer 108 to block the unwanted external light may improve display uniformity and reduce reflection as described above, recognizing alignment marks for accurate positioning of the components or for carrying out manufacturing process may become difficult. For example, accurate positioning of the components on the base layer 106 or the alignment during bending of the flexible display 100 can be difficult as the positioning of the layers may need to be determined by comparing the outer edges of the overlapping portions of the layer(s). Further, checking for unwanted debris or other foreign materials in the flexible display 100 can be problematic if the base layer 106 and/or the support layer 108 blocks the excessive range(s) of light spectrum (i.e., wavelengths in the visible, the ultraviolet and the infrared spectrum).

Accordingly, in some embodiments, the light blocking material, which may be included in the base layer 106 and/or the support layer 108 is configured to pass the light of certain polarization and/or the light within specific wavelength ranges usable in one or more manufacturing and/or testing processes of the flexible display 100. In way of example, the support layer 108 may pass the light used in the quality check, alignment processes (e.g., UV, IR spectrum light) during the manufacturing the flexible display 100, but filter the light in the visible light wavelength range. The limited range of wavelengths can help reduce the display non-uniformity problem, which may be caused by the shadows generated by the printed circuit film attached to base layer 106, especially if the base layer 106 includes the light blocking material as described above.

It should be noted that the base layer 106 and the support layer 108 can work together in blocking and passing specific types of light. For instance, the support layer 108 can change the polarization of light, such that the light will not be passable through the base layer 106. This way, certain type of light can be passed through the support layer 108 for various purposes during manufacturing of the flexible display 100, but unable to penetrate through the base layer 106 to cause undesired effects to the components disposed on the opposite side of the base layer 106.

Backplane of the flexible display 100 is implemented on the base layer 106. In some embodiments, the backplane of the flexible display 100 can be implemented with TFTs using low-temperature poly-silicon (LTPS) semiconductor layer as its active layer. Accordingly, the pixel circuit and the driving circuits (e.g., GIP) are implemented with NMOS LTPS TFTs. In some other embodiments, the backplane of the flexible display 100 may be implemented with a combination of N-Type LTPS TFTs and P-Type LTPS TFTs. For instance, the flexible display 100 may be provided with a CMOS GIP, implemented by using both the N-Type LTPS TFTs and P-Type LTPS TFTs.

Further, in some embodiments, the flexible display 100 may employ multiple kinds of TFTs to implement the driving circuits in the inactive area and/or the pixel circuits in the active. That is, a combination of an oxide semiconductor TFT and an LTPS TFT may be used to implement the backplane of the flexible display 100. In the backplane, the type of TFTs may be selected according to the operating conditions and/or requirements of the TFTs within the corresponding circuit.

Low-temperature-poly-silicon (LTPS) TFTs generally exhibit excellent carrier mobility even at a small profile, making them suitable for implementing condensed driving circuits. The excellent carrier mobility of the LTPS TFT makes it an ideal for components requiring a fast speed operation. Despite the aforementioned advantages, initial threshold voltages may vary among the LTPS TFTs due to the grain boundary of the poly-crystalized silicon semiconductor layer.

On the other hand, a TFT employing an oxide material based semiconductor layer such as an indium-gallium-zinc-oxide (IGZO) semiconductor layer (referred hereinafter as "the oxide TFT"), is different from the LTPS TFT in many respects. Although the oxide TFT has a lower mobility than the LTPS TFT, the oxide TFT is generally more advantageous than the LTPS TFT in terms of reducing the leakage current during its off state. In other words, the oxide TFT generally exhibits a higher voltage-holding ratio (VHR) than that of the LTPS TFT. The higher VHR of the oxide TFT can be of a great advantage for driving the pixels at a reduced frame rate when a high frame rate driving of the pixels is not needed.

The flexible display 100 may be provided with a feature in which the pixels of the entire active area or selective portion of the active area are driven at a reduced frame rate under a specific condition. By way of example, the pixels can be refreshed at a reduced refresh rate depending on the content displayed from the flexible display 100. Also, part of the active area displaying a still image data (e.g., user interface, text) may be refreshed at a lower rate than other part of the active area displaying rapidly changing image data (e.g., movie). The pixels driven at a reduced refresh rate may have an increased blank period, in which the data signal is not provided to the pixels. This would minimize the power wasted from providing the pixels with the same image data. In such embodiments, oxide TFTs can be used for some of the TFTs implementing the pixel circuits and/or the driving circuits of the flexible display 100 to minimize the leakage current during the blank period. By reducing the current leakage from the pixel circuits and/or the driving circuits, more stable level of brightness can be achieved from the pixels even when they are refreshed at a reduced rate.

In terms of stability, oxide TFTs do not suffer from the transistor-to-transistor initial threshold voltage variation issue as much as the LTPS TFTs. Such a property can be of a great advantage when increasing the size of the flexible display 100. On the other hand, the LTPS TFT may be better than the oxide TFT in terms of the positive bias temperature stress (PBTS) and the negative bias temperature stress (NBTS), which may cause unwanted threshold voltage shift during the use of the flexible display 100.

Considering the pros and cons of LTPS TFT and oxide TFT, some embodiments of the flexible display 100 disclosed herein may employ a combination of the LTPS TFT and the oxide TFT. In particular, some embodiments of the flexible display 100 can employ LTPS TFTs to implement the driving circuits (e.g., GIP) in the inactive area and employ oxide TFTs to implement the pixel circuits in the active area. Due to the excellent carrier mobility of the LTPS TFTs, driving circuits implemented with LTPS TFTs may operate at a faster speed than the driving circuits implemented with the oxide TFTs. In addition, more condensed driving circuits can be provided with the LTPS TFT, which reduces the size of the inactive area in the flexible display 100. With the excellent voltage holding ratio of the oxide TFTs used in the pixel circuits, leakage from the pixels can be reduced. This also enables to refresh pixels in a selective portion of the active area or to drive pixels at a reduced frame rate under a predetermined condition (e.g., when displaying still images) while minimizing display defects caused by the leakage current.

In some embodiments, the driving circuits in the inactive area of the flexible display 100 may be implemented with a combination of N-Type LTPS TFTs and P-Type LTPS TFTs while the pixel circuits are implemented with oxide TFTs. For instance, N-Type LTPS TFTs and P-Type LTPS TFTs can be used to implement a CMOS gate driver (e.g., CMOS GIP, Data Driver) whereas oxide TFTs are employed in at least some part of the pixel circuits. Unlike the GIP formed entirely of either the P-type or N-type LTPS TFTs, the gate out signal from the CMOS gate driver can be controlled by DC signals or logic high/low signals. This allows for more stable control of the gate out node of the gate driver during the blank period such that the suppression of current leakage from the pixel circuit or unintended activation of the pixels connected the gate node can be achieved.

It should be noted that the CMOS gate driver can be implemented by using a combination of LTPS TFTs and oxide TFTs. Likewise, in some embodiments, the pixel circuits in the active area can be implemented by using both the LTPS TFTs and the oxide TFTs. When employing both kinds of TFTs in the pixel circuit and/or the driving circuit, the LTPS TFT can be used for TFTs of the circuit, which are subjected to extended period of bias stress (e.g., PBTS, NBTS). In addition, the TFTs in a circuit, which are connected to a storage capacitor, can be formed of the oxide TFT to minimize leakage therefrom.

The organic light-emitting diode (OLED) element layer 102 is disposed on the base layer 106. The OLED element layer 102 includes a plurality of OLED elements, which is controlled by the pixel circuits and the driving circuits implemented on the base layer 106 as well as any other driving circuits connected to the connection interfaces on the base layer 106. The OLED element layer includes an organic-light emitting material layer, which may emit light of certain spectral color (e.g., red, green, blue). In some embodiments, the organic-light emitting material layer may have a stack configuration to emit white light, which is essentially a combination of multiple colored lights.

The encapsulation 104 is disposed on the OLED element layer 102. The encapsulation 104 may include multiple layers of materials for reducing permeation of air and moisture to protect OLED elements thereunder. In some embodiments, the encapsulation 104 may be provided in a thin film form.

The flexible display 100 may also include a polarization layer 110 for controlling the display characteristics (e.g., external light reflection, color accuracy, luminance, etc.) of the flexible display 100. The cover layer 114 may be used to protect the flexible display 100.

Electrodes for sensing touch input from a user may be formed on an interior surface of a cover layer 114 and/or at least one surface of the polarization layer 110. If desired, an separate independent layer that includes the touch sensor electrodes and/or other components associated with sensing of touch input (referred hereinafter as touch-sensor layer 112) may be provided in the flexible display 100. The touch sensor electrodes (e.g., touch driving/sensing electrodes) may be formed from transparent conductive material such as indium tin oxide, carbon based materials like graphene or carbon nanotube, a conductive polymer, a hybrid material made of mixture of various conductive and non-conductive materials. Also, metal mesh (e.g., aluminum mesh, silver mesh, etc.) can also be used as the touch sensor electrodes.

The touch sensor layer 112 may include a layer formed of one or more deformable dielectric materials. One or more electrodes may be interfaced with or positioned near the touch sensor layer 112, and loaded with one or more signals to facilitate measuring electrical changes on one or more of the electrodes upon deformation of the touch sensor layer 112. The measurement may be analyzed to assess the amount of pressure at a plurality of discrete levels and/or ranges of levels on the flexible display 100.

In some embodiments, the touch sensor electrodes can be utilized in identifying the location of the user inputs as well as assessing the pressure of the user input. Identifying the location of touch input and measuring of the pressure of the touch input on the flexible display 100 may be achieved by measuring changes in capacitance from the touch sensor electrodes on one side of the touch sensor layer 112. Also, measuring the amount of pressure may utilize at least one electrode other than the touch sensor electrodes to measure at least one other signal, which may be obtained simultaneously with the touch signal from the touch sensor electrodes or obtained at a different timing.

The deformable material included in the touch sensor layer 112 may be an electro-active material, which the amplitude and/or the frequency of the deformation is controlled by an electrical signal and/or electrical field. The examples of such deformable materials include piezo ceramic, electro-active-polymer (EAP) and the like. Accordingly, the touch sensor electrodes and/or separately provided electrode can activate the deformable material to bend the flexible display 100 to desired directions. In addition, such electro-active materials can be activated to vibrate at desired frequencies, thereby providing tactile and/or texture feedback on the flexible display 100. It should be appreciated that the flexible display 100 may employ a plurality of electro-active material layers so that bending and vibration of the flexible display 100 can be provided simultaneously or at a different timing. Such a combination can be used in creating sound waves from the flexible display 100.

Components of the flexible display 100 may make it difficult to bend the flexible display 100 along the bend line BL. Some of the elements, such as the support layer 108, the touch sensor layer 112, the polarization layer 110 and the like, may add too much rigidity to the flexible display 100. Also, the thickness of such elements shifts the neutral plane of the flexible display 100 and thus some of the components may be subject to greater bending stresses than other components.

To facilitate easier bending and to enhance the reliability of the flexible display 100, the configuration of components in the bend portion of the flexible display 100 differs from the substantially flat portion of the flexible display 100. Some of the components existing in the substantially flat portion may not be disposed in the bend portions of the flexible display 100, or may be provided in a different thickness. The bend portion may free of the support layer 108, the polarization layer 110, the touch sensor layer 114, a color filter layer and/or other components that may hinder bending of the flexible display 100. Such components may not be needed in the bend portion if the bend portion is to be hidden from the view or otherwise inaccessible to the users of the flexible display 100.

Even if the secondary active area is in the bend portion for providing information to users, the secondary active area may not require some of these components depending on the usage and/or the type of information provided by the secondary active area. For example, the polarization layer 110 and/or color filter layer may not be needed in the bend portion when the secondary active area is used for simply emitting colored light, displaying texts or simple graphical user interfaces in a contrast color combination (e.g., black colored texts or icons in white background). Also, the bend portion of the flexible display 100 may be free of the touch sensor layer 114 if such functionality is not needed in the bend portion. If desired, the bend portion may be provided with a touch sensor layer 112 and/or the layer of electro-active material even though the secondary active area for displaying information is not provided in the bend portion.

Since the bend allowance section is most heavily affected by the bend stress, various bend stress-reducing features are applied to the components on the base layer 106 of the bend allowance section. To this end, some of the elements in the central portion may not be formed in at least some part of the bend portion. The separation between the components in the central portion and the bend portion may be created by selectively removing the elements at the bend allowance section of the flexible display 100 such that the bend allowance section is free of the respective elements.

As depicted in FIG. 4, the support layer 108 in the central portion and the support layer 108 in the bend portion can be separated from each other by the absence of the support layer 108 under the base layer 106 at the bend allowance section. Instead of using the support layer 108 attached to the base layer 106, the rounded end portion of the support member 116 can be positioned underside of the base layer 106 at the bend allowance section as described above. Various other components, for example the polarization layer 110 and the touch sensor layer 114 and more, may also be absent from the bend allowance section of the flexible display 100. The removal of the elements may be done by cutting, wet etching, dry etching, scribing and breaking, or other suitable material removal methods. Rather than cutting or otherwise removing an element, separate pieces of the element may be formed at the selective portions (e.g., substantially flat portion and the bend portion) to keep the bend allowance section free of such element.

Figure 5:
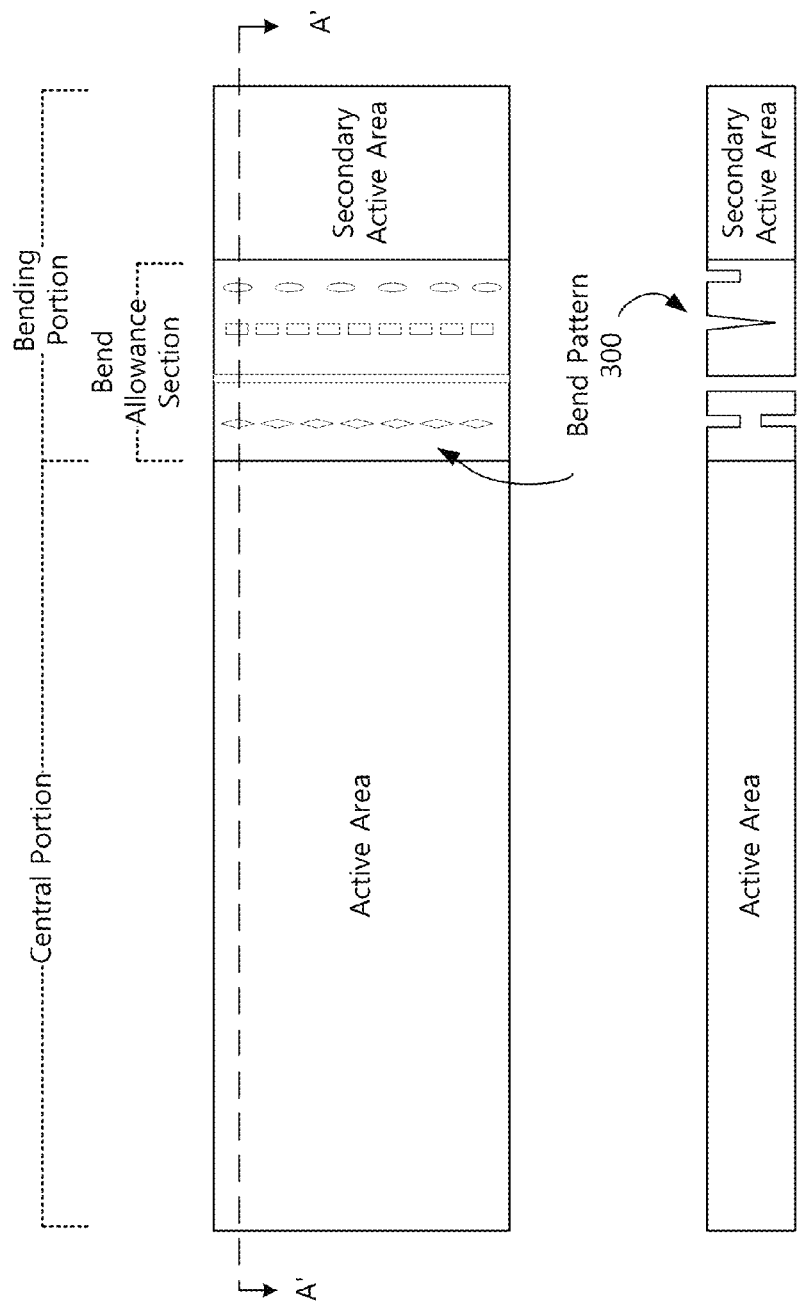
FIG. 5 illustrates various examples of bend patterns applicable to facilitate bending of a display apparatus.

Instead of being entirely removed from the bend portion, some elements may be provided with a bend pattern along the bend lines and/or the parts within the bend allowance section to reduce the bend stress. FIG. 5 illustrates a plane view and a cross-sectional view of exemplary bend patterns 300. The bend patterns 300 described above may be used in the support layer 108, the polarization layer 110, the touch sensor layer 114 and various other elements of the flexible display 100.

The flexible display 100 may utilize more than one types of bend patterns. It should be appreciated that a number of bend patterns and the types of the bend patterns 300 utilized by the components is not limited. If desired, the depth of the patterns may not be deep enough to penetrate through the component entirely but penetrate only partially through the respective layer. As will be described in further detail below, a buffer layer positioned between the base layer 106 and the TFT as well as a passivation layer covering a conductive line trace may be also be provided with the bend pattern for reducing bend stress.

Support Member

As mentioned, the support layer 108 may not be present at the bend allowance section to facilitate easier bending of the base layer 106. Absent the support layer 108, however, the curvature at the bend allowance section may be easily altered by external force. To support the base layer 106 and maintain the curvature at the bend allowance section, the flexible display 100 may also include a support member 116, which may also be referred to as a "mandrel." The exemplary support member 116 depicted in FIG. 4 has an elongated body portion and a rounded end portion. The base layer 106 and the support member 116 are arranged so that that the rounded end portion of the support member 116 is positioned at the underside of the base layer 106 corresponding to the bend allowance section of the flexible display 100.

In embodiments where a bend portion is provided at an edge of the flexible display 100, the support member 116 can be provided at the edge of the flexible display 100. In this setting, a part of the base layer 106 may come around the rounded end portion of the support member 116 and be positioned at the underside the support member 116 as depicted in FIG. 4. Various circuits and components in the inactive area of the flexible display 100, such as drive ICs and interfaces for connecting chip-on-flex (COF) and flexible printed circuit board (FPCB), may be provided on the base layer 106 that is positioned at the rear side of the flexible display 100. In this way, even the components that are not flexible enough to be bent in a bend radius desired by the flexible display 100 can be placed under the active area of the flexible display 100.

The support member 116 can be formed of plastic material such as polycarbonate (PC), polyimide (PI), polyethylene naphthalate (PEN), polyethylene terephthalate (PET), other suitable polymers, a combination of these polymers, etc. The rigidity of the support member 116 formed of such plastic materials may be controlled by the thickness of the support member 116 and/or by providing additives for increasing the rigidity. The support member 116 can be formed in a desired color (e.g., black, white, etc.). Further, the support member 116 may also be formed of glass, ceramic, metal or other rigid materials or combinations of aforementioned materials.

The size and the shape of the rounded end portion of the support member 116 can vary depending on the minimum curvature desired at the bend allowance section of the flexible display 100. In some embodiments, the thickness of the rounded end portion and the thickness of the elongated body portion may be substantially the same. In other embodiments, the elongated body portion, which has a planar shape, may be thinner than the rounded end portion of the support member 116. With a thinner profile at the elongated body portion, the support member 116 can support the bend allowance section while avoiding unnecessary increase in the thickness in the flexible display 100.

Since the support at the bend allowance section is provided by the rounded end portion of the support member 116, the elongated planar portion extending toward the substantially flat portion of the flexible display 100 needs not be extended into the active area. While the elongated body portion can be extended under the active area for various reasons, the length of the elongated body portion from the rounded end portion towards the opposite end is sufficient so long as it provides enough surface area for securing the support member 116 in a desired location of the flexible display 100.

To secure the support member 116 in the flexible display 100, an adhesive layer 118 may be provided on the surface of the support member 116. The adhesive layer 118 may include a pressure-sensitive adhesive, a foam-type adhesive, a liquid adhesive, a light-cured adhesive or any other suitable adhesive material. In some embodiments, the adhesive layer 118 can be formed of, or otherwise includes, a compressible material and serve as a cushion for the parts bonded by the adhesive layer 118. As an example, the constituent material of the adhesive layer 118 may be compressible. The adhesive layer 118 may be formed of multiple layers, which includes a cushion layer (e.g., polyolefin foam) interposed between an upper and a lower layers of an adhesive material.

The adhesive layer 118 can be placed on at least one of the upper surface and the lower surface of the elongated body portion of the support member 116. When the bend portion of the flexible display 100 wraps around the rounded end portion of the support layer 116, an adhesive layer 118 can be provided on both the lower surface (i.e., the surface facing the rear side) and the upper surface (i.e., the surface facing the front side) of the elongated body portion. If desired, an adhesive layer 118 may be provided between the surface of the rounded end portion of the support member 116 and the inner surface of the base layer 106.

During bending, a part of the flexible display 100 on one side of the support member 116 may be pulled toward the support member 116, and the base layer 106 may be damaged by the highest and the lowest edges of the rounded end portion. As such, the height of the adhesive layer 118 and the support layer 108 between the support member 116 and the base layer 106 may be at least equal to or greater than the vertical distance between the highest edge of the rounded end portion and the surface of the elongate body portion where the adhesive layer 118 is placed. In other words, the height of the space created by the thickness difference between the rounded end portion and the elongated body portion of the support member 116 may be equal to or less than the collective thickness of the support layer 108 and the adhesive layer 118.

Depending on the shape of the support member 116, a thickness of the adhesive layer 118 on the upper and the lower surfaces of the elongated body portion may be different. For instance, the elongated body portion, which is thinner than the rounded end portion, may not be at the center of the rounded end portion of the support member 116. In such cases, the space on one side of the support member 116 may be greater than the space on the opposite side.

In another example, the lowest edge of the rounded end portion may be in-line with the bottom surface of the elongated body portion such that the space is provided only on one side of the elongated body portion. In such cases, the adhesive layer 118 on one side of the elongated body portion of the support member 116 can be thicker than the one on the opposite side. It should be appreciated that the dimensions of the support member 116 in FIG. 4 may be exaggerated for the purposes of simpler explanation.

Exemplary Arrangement

Figure 6A:
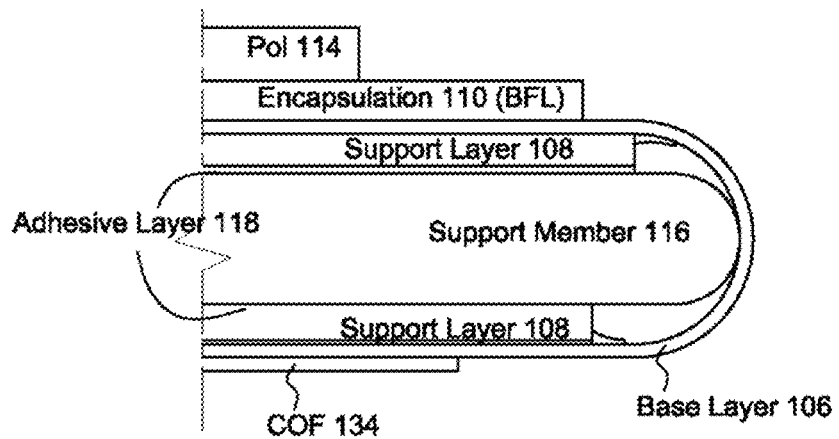
FIGS. 6A-6C are cross-sectional views of illustrative arrangement of components in a display apparatus according to embodiments of the present disclosure.
Figure 6B:
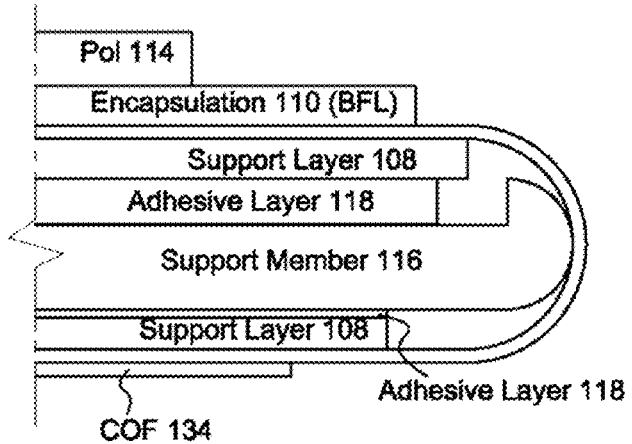
Figure 6C:
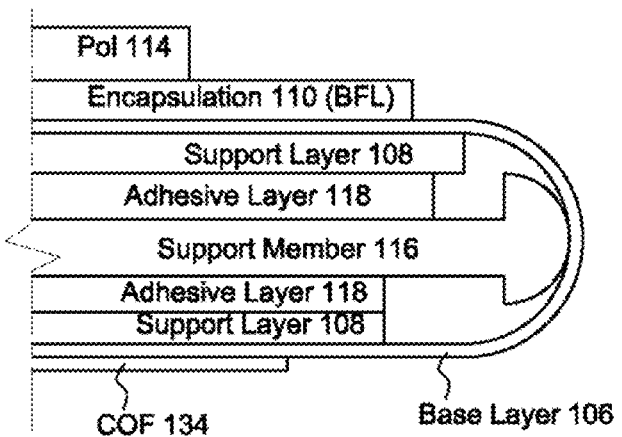

FIGS. 6A, 6B and 6C are simplified cross-sectional view showing an exemplary arrangement of elements in various embodiments of the flexible display 100. In one suitable configuration, the thickness of the rounded end portion and the elongated body portion of the support member 116A may be substantially the same as illustrated in FIG. 6A. Such a support member 116A can be formed of the plastic materials mentioned above. The support member 116A may also be formed of a folded thin sheet metal (e.g., SUS). In this case, the folded edge of the sheet metal can serve as the rounded end portion of the support member 116A. Even when a sheet metal is used to form the support member, the rounded end portion can have greater thickness than the elongated body portion. For instance, pressure can be applied on the part of the folded metal sheet for the elongated body portion to make that portion thinner than the folded edge.

In FIG. 6A, the adhesive layer 118A is illustrated as being applied on the upper, the lower surface and the surface of the rounded end portion of the support member 116A. As the thickness of the support member 116A at the rounded end portion and the elongated body portion is about the same, the thickness of the adhesive layer 118A may have a substantially uniform thickness on the surface of the support member 116A. However, it should be noted that the adhesive layer 118A can be thinner and/or thicker at selective parts of the support member 116A.

In another suitable configuration, the elongated body portion of the support member 116 is thinner than its rounded end portion. In this regard, the bottom surface of the elongated body portion is in-line with the lowest edge of the rounded end portion, providing a support member 116B with a flat bottom as depicted in FIG. 6B. In this exemplary configuration, the support members 116B may be formed of one or a combination of aforementioned plastic materials (e.g., polycarbonate). Also, the adhesive layer 118B provided on the upper surface of the elongated body portion is thicker than the adhesive layer 118B provided on the bottom surface of the elongated body portion of the support member 116B. The adhesive layer 118B on the upper surface of the elongated body portion may include a cushion layer described above while the adhesive layer 118B on the lower surface does not.

In yet another suitable configuration shown in FIG. 6C, neither the top nor the bottom surfaces of the elongated body portion of the support member 116C is in-line with the highest/lowest edges of the rounded portion. The support members 116C may be formed of one or a combination of aforementioned plastic materials (e.g., polycarbonate). In this example, the elongated body portion is off-centered (i.e., closer to the lowest edge of the rounded portion), and the adhesive layer 118C on the upper surface of the elongated body portion is thicker than the adhesive layer 118C on the lower surface. The adhesive layer 118C on the upper surface of the elongated body portion may include a cushion layer described above while the adhesive layer 118C on the lower surface does not.

In the exemplary configurations depicted in FIGS. 6A-6C, the support layer 108 on the upper side of the support member 116 is extended further out toward the bend allowance section than the encapsulation 114 there above. In other words, a part of the base layer 106 toward the bend allowance section is not covered by the encapsulation 114, but provided with the support layer 108 thereunder. The extra length of the support layer 108 can help in keeping a steady rate of curvature in the bend allowance section. The edge of the support layer 108 under the support member 116 may be shifted away from the bend allowance section. In some embodiments, the edge of the support layer 108 toward the bend allowance section can be provided with a flange, which extends even further out toward the bend allowance section as shown in FIG. 6A. In one example, the flange may be made by cutting, or otherwise patterning, the support layer 108 to have a tapered edge. In another example, the flange can be provided by stacking at least two support layers with their edges shifted from each other. While omitted in FIGS. 6B and 6C, the flange can be provided in those embodiments as well.

It should be appreciated that the configurations described above in reference to FIGS. 6A-6C are merely illustrative. Adhesive layers having the same thickness can be provided on the upper and the lower surfaces of the support member regardless of the position of the elongated body portion. Further, adhesive layers on both the upper surface and the lower surface of the support member can include a cushion layer.

Wire Trace

Several conductive lines are included in the flexible display 100 for electrical interconnections between various components therein. The circuits fabricated in the active area and inactive area may transmit various signals via one or more conductive lines to provide a number of functionalities in the flexible display 100. As briefly discussed, some conductive lines may be used to provide interconnections between the circuits and/or other components in the central portion and the bend portion of the flexible display 100.

As used herein, the conductive lines broadly refers to a trace of conductive path for transmitting any type of electrical signals, power and/or voltages from one point to another point in the flexible display 100. As such, conductive lines may include source/drain electrodes of the TFTs as well as the gate lines/data lines used in transmitting signals from some of the display driving circuits (e.g., gate driver, data driver) in the inactive area to the pixel circuits in the active area. Likewise, some conductive lines, such as the touch sensor electrodes, pressure sensor electrodes and/or fingerprint sensor electrodes may provide signals for sensing touch input or recognizing fingerprints on the flexible display 100. Conductive lines can also provide interconnections between the pixels of the active area in the central portion and the pixels of the secondary active area in the bend portion of the flexible display 100. It should be appreciated that the aforementioned functionalities of conductive lines in the flexible display 100 are merely illustrative.

Figure 7A:
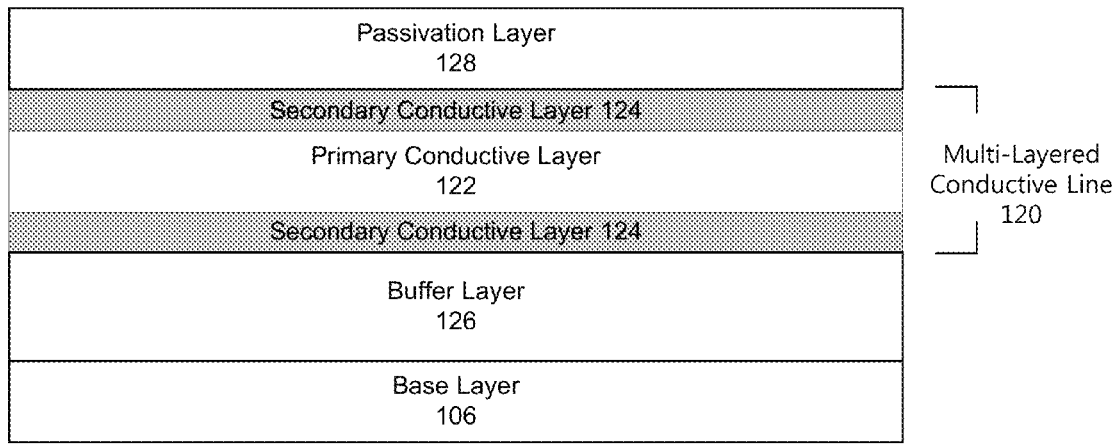
FIGS. 7A-7B illustrate schematic view of an exemplary configuration of multi-layered conductive lines and insulation layers according to embodiments of the present disclosure.
Figure 7B:
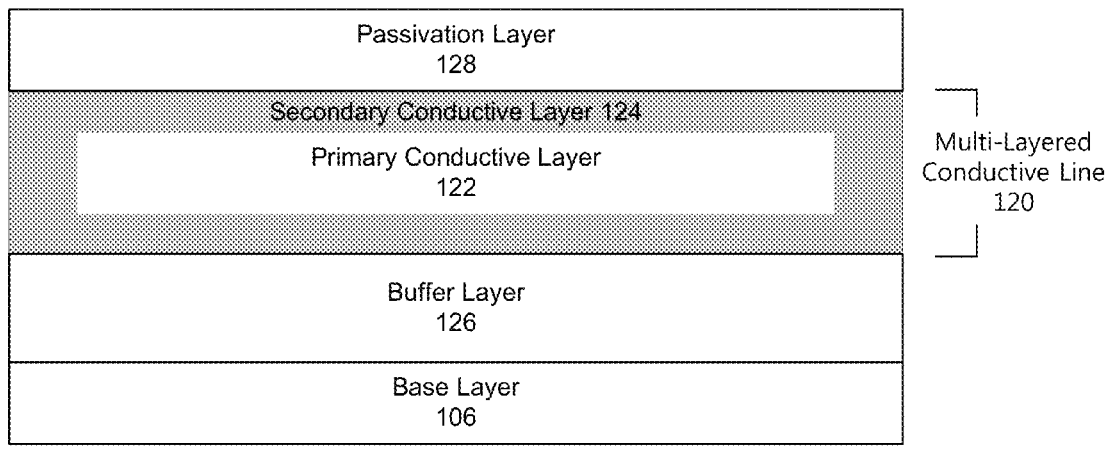

Some conductive lines of the flexible display 100 may have a multi-layered structure, which may allow more flexibility with less chance of breakage. FIGS. 7A and 7B each illustrates exemplary stack structure of the conductive line trace 120. In FIG. 7A, the conductive line trace 120 may have a multi-layered structure in which the primary conductive layer 122 is sandwiched between the secondary conductive layers 124. The primary conductive layer 122 may be formed of material with a lower electrical resistance than that of the secondary conductive layer 144. Non-limiting examples of the materials for the primary conductive layer 122 includes copper, aluminum, transparent conductive oxide, or other flexible conductors. The secondary conductive layer 124 should be formed of conductive material that can exhibit sufficiently low ohmic contact resistance when formed in a stack over the primary conductive layer 122.

Examples of such combination include an aluminum layer sandwiched between titanium layers (Ti/Al/Ti), an aluminum layer sandwiched between upper and lower molybdenum layers (Mo/Al/Mo), a copper layer sandwiched between titanium layers (Ti/Co/Ti) and a copper layer sandwiched between upper and lower molybdenum layers (Mo/Co/Mo). However, the low ohmic contact resistance of the conductive layer stack is not the only factor for choosing the materials for the conductive line trace 120 used in the flexible display 100.

The materials for forming the conductive line trace 120 should meet the minimum mechanical stress requirement while meeting the stringent electrical and thermal requirements of the flexible display 100 (e.g., resistance, heat generation, etc.). Accordingly, both the primary conductive layer 122 and the secondary conductive layer 124 should be formed of materials exhibiting low brittleness. In this regard, Al has a modulus of about 71 GPa, Ti has a modulus of 116 GPa, and Mo has a modulus of 329 GPa. As such, the brittleness of Al is about ¼ of that of Mo, and the brittleness of Ti is about ⅓ of that of Mo. Accordingly, in some embodiments, at least some of the conductive lines 120 of the flexible display 100 are formed of a stack including Al and Ti. Since the primary conductive layer 122 should have lower electrical resistance than the secondary conductive layer 124, the conductive line trace 120 may be formed in a stack of Ti/Al/Ti. In particular, at least some of the conductive lines 120 disposed in the bend allowance section may be formed in a stack of Ti/Al/Ti.

In some embodiments, the flexible display 100 may operate under humid environment. For example, the flexible display 100 may be employed in a wearable electronic device or submergible electronic device. In some cases, moistures can reach the conductive line trace 120. Dissimilar metals and alloys have different electrode potentials, and when two or more come into contact in an electrolyte, one metal acts as anode and the other as cathode. The electropotential difference between the dissimilar metals is the driving force for an accelerated attack on the anode member of the galvanic couple, which is the primary conductive layer 122 in the Ti/Al/Ti stack. The anode metal dissolves into the electrolyte, and deposit collects on the cathodic metal.

For a multi-layered conductive line trace 120 shown in FIG. 7A, galvanic corrosion can be initiated by the electrolyte that is in contact at the cross-sectional side of a multi-layered conductive line trace 120. Accordingly, in some embodiments, at least some conductive lines 120 is provided with a structure in which the primary conductive layer 122 is surrounded by the secondary conductive layer 124 such that the primary conductive layer 122 are covered by the secondary conductive layer 124 as shown in FIG. 7B. In this way, the loss of primary conductive layer 122 by galvanic corrosion can minimized, and further reduce probability of severance of electrical conductivity.

Such a multi-layered conductive lines 120 can be created by first depositing the material for the primary conductive layer 122 (e.g., Al) over the secondary conductive layer 124 (e.g., Ti). Here, the secondary conductive layer 124 underneath the primary conductive layer 122 may have greater width. Etch resist material is formed over the stack of these two layers and etched (e.g., dry etch, wet etch, etc.) to form a desired a conductive line trace (e.g., diamond trace design). After striping the etch resistance material, another layer of secondary conductive layer 124 (i.e., Ti) is deposited over the patterned structure (i.e., Ti/Al). Again, the secondary conductive layer 124 on top of the primary conductive layer 122 may have greater width such that the primary conductive layer 122 is enclosed within the secondary conductive layer 124. Another round of dry etching and striping of the etch resistance material is performed to form the stack of the multi-layered structure (i.e., Ti/Al/Ti) in a desired conductive line trace design.

Some of the conductive lines may be extended from the substantially flat portion of the flexible display 100 to the bend portion of the flexible display 100. In such cases, some portions of the conductive lines may be configured differently from the other portions to withstand the bending stress. In particular, the portion of the conductive lines laid over the bend allowance section of the flexible display 100 may include several features for reducing cracks and fractures of the conductive lines to maintain proper interconnection.

Also, various insulation layers, such as the a buffer layer 126, the passivation layer 128, a gate insulation layer (GI layer) and an interlayer dielectric layer (ILD layer) may be formed at the lower and/or upper side of the conductive line trace 120. These insulation layers may be formed of organic and/or inorganic materials or include a sub-layer formed of inorganic materials.

Among various insulation layers in the flexible display 100, layers that are formed of inorganic material are generally less ductile than the metals of the conductive line trace 120. Given the same amount of bending stress, cracks generally initiate from the insulation layers rather than the conductive line trace 120. Even if the conductive lines trace 120 has sufficient modulus to withstand the bending stress without a crack, the cracks initiated from the insulation layer tend to grow and propagate into the conductive lines 120, which would create spots of poor electrical contacts and render the flexible display 100 unusable. Accordingly, various bending stress reduction techniques are utilized in both the insulation layers and the conductive lines 120.

Trace Design

A trace designs plays an important role in reducing the bending stress in both the conductive line trace 120 and the insulation layers. For convenience of explanation, the conductive line trace 120 and the trace of insulation layer (i.e., passivation layer 128) covering at least some part of the conductive line trace 120 are collectively referred to as the "wire trace" in the following description.

The trace design should be determined by considering the electrical requirements of the conductive line trace 120 as well as the type of signals transmitted on the conductive line trace 120. Also, the properties of the materials (e.g., Young's modulus) used in forming the conductive line trace 120 and the insulation layers can be considered in designing the traces. It should be noted that various other factors such as a thickness, a width, a length, a layout angle for a section as well as for the entirety of the conductive line trace 120 and the insulation layers may need to be considered to provide a trace design having sufficient electrical and mechanical reliability for use in the flexible display 100.

With these factors in mind, a wire trace design may be specifically tailored for the conductive line trace 120 and the insulation layers based on their placement and orientation in reference to the bending direction (i.e., tangent vector of the curve) of the flexible display 100. A wire trace will be subjected to more bending stress as the direction in which the wire trace extends is more aligned to the tangent vector of the curvature. In other words, a wire trace will withstand better against the bending stress when the length of the wire trace aligned to the tangent vector of the curvature is reduced.

Figure 8:
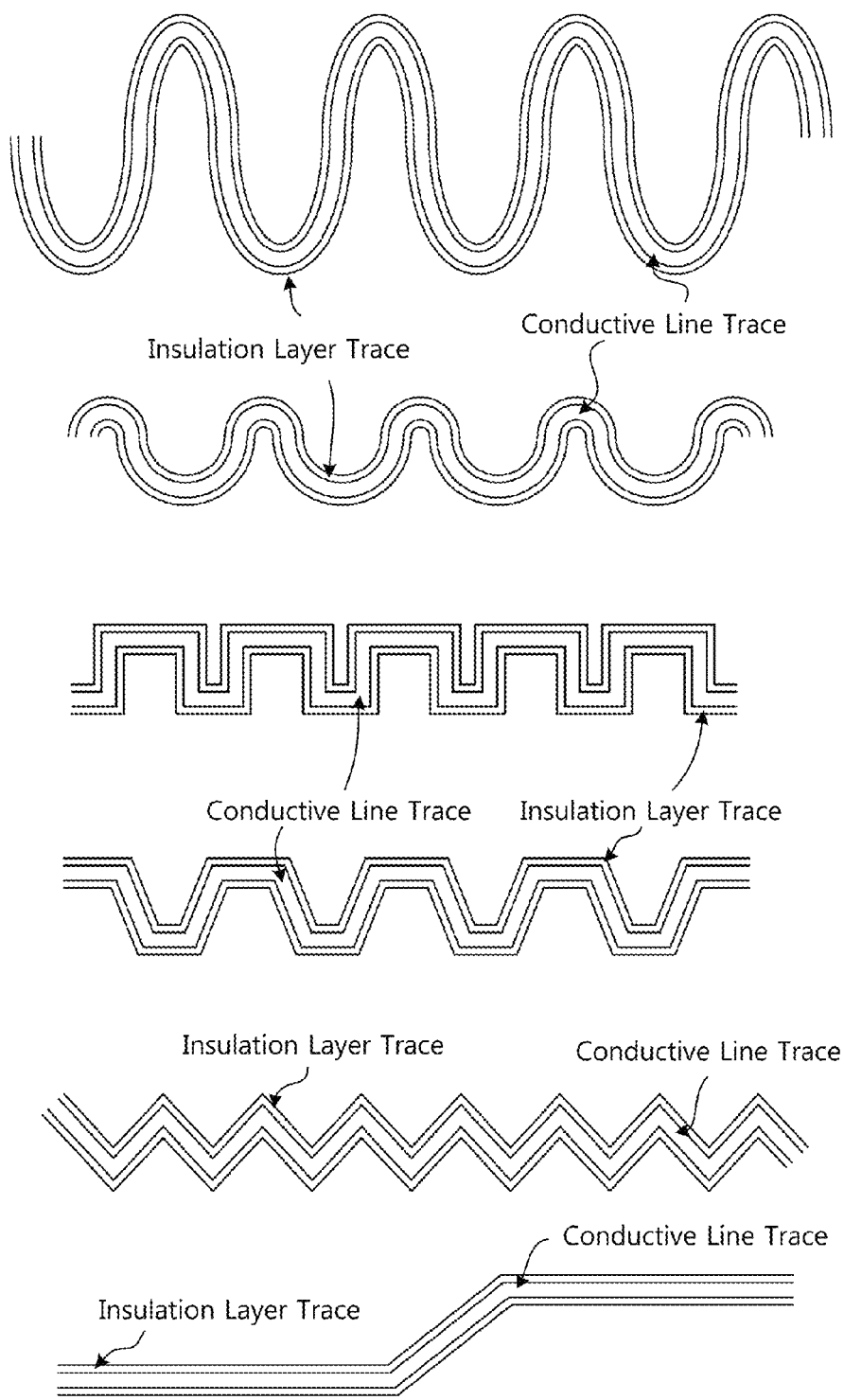
FIG. 8 illustrates schematic view of exemplary non-split strain-reducing trace designs usable for conductive lines in a display apparatus according to embodiments of the present disclosure.

In order to reduce the length of the wire trace portion being aligned to the tangent vector of the curvature, wire traces of the flexible display 100 may employ any one or more of a sign-wave, a square-wave, a serpentine, a saw-toothed and a slanted line trace designs illustrated in FIG. 8. In such configurations, the bending stress may be distributed to the trace portions oriented in an angle shifted away from the tangent vector of the curvature. The strain-reducing trace designs illustrated in FIG. 8 are merely exemplary and should not be construed as limitations to the trace designs that can be used in the embodiments of the flexible display 100.

Some conductive line trace 120 may adopt different strain-reducing trace designs from other conductive line trace 120 of the flexible display 100. In some embodiments, the conductive line trace 120 can have varying dimensions to facilitate tight spacing between the conductive lines. For instance, a convex side of a first wire trace may be placed in a concave side of a second wire trace next to the first wire trace.

In order to prevent or minimize severance of interconnections by cracks in the conductive line trace 120, the wire trace may split into multiple sub-traces, which converge back into a single wire trace at a certain interval. That is, a single conductive line trace 120 can include two or more sub-traces, which split and merge at every joint X. From a first joint X, one of the sub-traces extends in a first direction that is angled away from the tangent vector of the curvature for a predetermined distance, and then extends in a second direction towards a second joint X. At least one other sub-trace from the first joint X to the second joint X is arranged in the similar manner, but in mirrored orientation in reference to the tangent vector of the curvature. The two sub-traces of the conductive line 120 between the two adjacent joint X surround an open area that is free of the conductive line trace 120.

The distances and directions in which the sub-traces are arranged between the two adjacent joints X define the shape and the size of the conductive line trace 120 as well as the open area surrounded by the sub-traces. Further, the insulation layers covering the surface of the conductive line trace 120 with the aforementioned strain-reducing trace design is patterned in a trace design corresponding to the conductive line trace 120. As such, the open area surrounded by the sub-traces of the conductive line trace 120 is free of the inorganic insulation layer(s), or otherwise has thinner layer inorganic insulation layer(s) than the areas under and/or above the conductive line trace 120.

Figure 9A:
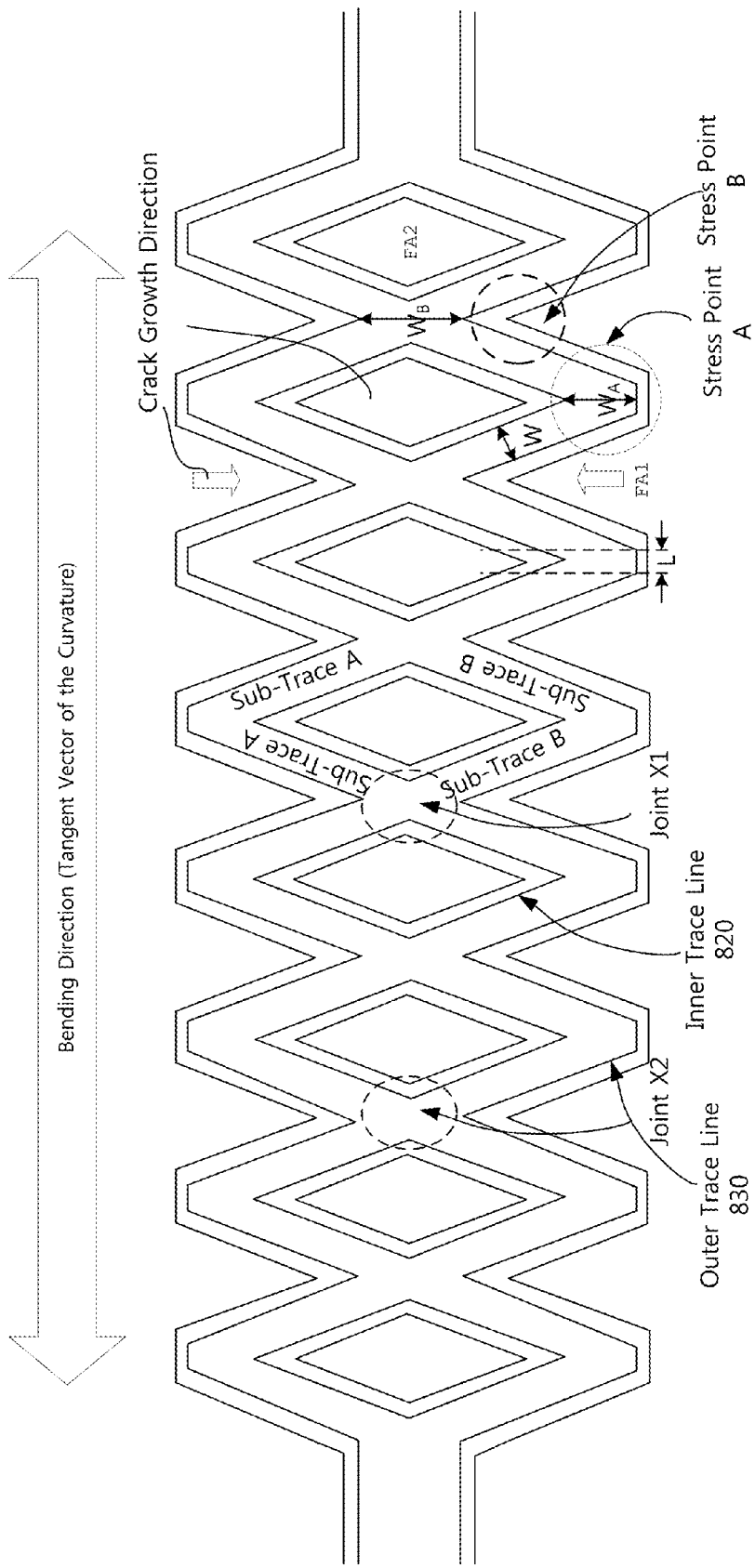

By way of an example, a conductive line trace 120 depicted in FIG. 9A includes sub-traces A and B that split and merge back between two adjacent joints X-1 and X-2. From a first joint X-1, the sub-trace A extends in a first angled direction from the tangent vector of the curvature for a predetermined distance, and then extends in a second angled direction from the tangent vector of the curvature to reach the second joint X-2. In this example, the shape of the conductive line 120 between the joint X-1 and X-2 resembles a diamond with the sub-trace A and the sub-trace B surrounding an open area. The shape of the open area can correspond to the shape of the conductive line trace 120. With additional joints X, the conductive line trace 120 forms a chain of diamonds, and thus the trace design may be referred to as the diamond trace design.

Compare to the non-split strain-reducing trace designs shown in FIG. 8, the strain-reducing trace design shown in FIG. 9A can provide significant advantages in terms of electrical property. For instance, the wire trace provided with the diamond trace design can provide much lower electrical resistance than the wire traces employing the mountain trace design, the sign-wave trace designs or other single line strain-reducing trace designs. In addition, sub-traces may serve as a backup electrical pathway in case one of the sub-traces is damaged or severed by cracks.

Accordingly, in some embodiments, at least some of the conductive line traces 120 in the bend portion of the flexible display is provided with the diamond trace design. The diamond trace design can be applied to the part of the wire traces at the bend allowance section. The strain-reducing trace design of FIG. 9A includes the sub-traces that are arranged to extend in the directions angled away from the tangent vector of the curvature. This reduces the length of the conductive line trace 120 being aligned with the tangent vector of the curvature. As described above, the distribution of the bending stress depends on the vector (i.e., split angle) of the sub-traces in reference to the bending direction. Accordingly, the sub-trace having a larger split angle away from the bending direction (i.e., tangent vector of the curvature) will be subjected to less bending stress.

Since the cracks generally initiate from the inorganic insulation layer covering the surfaces of the conductive line trace, it is imperative that the length of the insulation layer trace being aligned with the tangent vector of the curvature is also minimized. To this end, various parameters must be considered in designing the strain-reducing trace design. In the single line strain-reducing designs, the width and the shape of the conductive line trace as well as the width of the patterned inorganic insulation layers interfacing with the surface of the conductive line trace should be kept minimal.

In the strain-reducing trace designs based on a plurality of sub-traces as discussed above, various additional factors must be considered. Given the widths of the conductive line trace 120 and the inorganic insulation layers, the angles in which the sub-traces split and merge between the joints X should be large enough so that a sufficient offset exists between the inorganic insulation layers covering the conductive line trace 120 at the joints X and the points of the sub-trace where its direction changes between the two adjacent joints X. Also, the length in which the part of sub-trace from a joint X extends before its direction changes toward the next joint X to merge back should also facilitate creation of the offset among the parts of the insulation layers covering the surface of the conductive line trace. To put it in other way, the open area, which is surrounded by the sub-traces between the two joints X, should have a size and a shape to minimize the length in which an inorganic insulation layer trace of the wire trace extending parallel to the tangent vector of the curvature.

In the diamond trace design depicted in FIG. 9A, the buffer layer 126 and the passivation layer 128 covering the outer surface of the conductive line trace 120 form an insulation layer trace with a predetermined margin from the outer trace of the conductive line 120. Accordingly, other than the insulation layers with the predetermined margin remaining to cover the conductive line trace, the open area surrounded by the sub-traces A and B is free of the insulation layers.

The length of the open area without the insulation layers measured in orthogonal direction from the bending direction is greater than the width of the inorganic insulation layer trace at the joint X measured in the same direction. In this setting, the open area surrounded by the sub-traces A and B as well as the area next to the joint X can be free of the inorganic insulation layers, or otherwise provided with a reduced number of inorganic insulation layers. These areas provided by the offset between the parts of the insulation layers at the middle of the sub-traces and at the joint X, reduces the length of the insulation layers in the wire trace to extending in a continuous straight line.

Referring to FIG. 9A, the insulation layer free area FA1 prohibits the insulation layer of the sub-trace A and the sub-trace B between the two joints X1 and X2 to be extended in a continuous straight line. Similarly, the insulation layer free area FA2 prohibits the insulation layer between the two joints X1 and X2 to be extended in a continuous straight line. Accordingly, the length of each segment of the insulation layer trace being aligned to the tangent vector of the curvature is reduced.

Not only does the diamond trace design provide much lower crack initiation rate, but it also hinders the propagation of cracks to the conductive line trace 120. Further reduction in the length of the insulation layer trace aligned to the tangent vector of the curvature can be obtained by reducing the width of the conductive line trace 120 and the insulation layer covering the conductive line trace 120. The amount of reduction in the width of conductive line trace 120 is limited with the single line strain-reducing trace designs depicted in FIG. 8 as the electrical resistance of the conductive line trace 120 can become too high to be used for the flexible display 100. However, the additional electrical pathway created by splitting and merging of the conductive line trace 120 yields much lower electrical resistance in the conductive line trace 120.

A lower chance of crack initiation is afforded in the wire trace by selectively increasing the angle of sub-traces in the wire trace at high bending stress regions. With sub-traces that split and merge at a greater angle away from the bending direction, more thorough reduction in the lengths of the conductive line trace 120 and the insulation layer extending along the tangent vector of the curvature. This way, unnecessary increase in the electrical resistance can be avoided.

It should be noted that the splitting angle of the sub-traces can affect the distance between the two adjacent joints X in the diamond trace design. The distance between the joints X need not be uniform throughout the entire wire trace. The intervals at which the trace splits and merges can vary within a single trace of wire based on the level of bending stress exerted on the parts of the wire trace. The distance between the joints X may be progressively shortened down for the parts of the wire trace towards the area of the flexible display 100 subjected to higher bending stress (e.g., area having smaller bend radius, area having larger bend angle). Conversely, the distances between the joints X can progressively widen out towards the area subjected to lower bending stress.

In an exemplary trace design of FIG. 9B, the distance between the joints X of a trace in the end sections is at a first distance (e.g., 27 um), but the distance becomes progressively shorter toward the mid-section of the trace. In the mid-section, the distance between the joints X is reduced by half. The end sections of the trace shown in FIG. 9B may be for the part of the wire trace near the beginning of a bend allowance section, and the mid-section of the trace may be for the part positioned at or near the middle of the bend allowance section of the flexible display 100.

Even with the strain-reducing trace design, the inevitable bending stress remains at certain points of the trace (i.e., stress point). The location of stress point is largely dependent on the shape of the trace as well as the bending direction. It follows that, for a given bending direction, the wire trace can be designed such that the remaining bending stress would concentrate at the desired parts of the wire trace. Knowing the location of the stress point in the wire trace, a crack resistance area can be provided to the stress point to make the wire trace last longer against the bending stress.

Referring back to FIG. 9A, when a wire trace having the diamond trace design is bent in the bending direction, the bending stress tends to focus at the angled corners (i.e., the vertexes of each diamond shaped link), which are denoted as the stress point A and stress point B. For instance, at the stress points A, a crack may initiate from the inner wire trace line 820 and grows towards the outer wire trace line 830. Similarly, a crack may initiate from the outer wire trace line 830 and grow towards the inner wire trace line 820 at the stress points B.

Accordingly, the width of the conductive line trace 120 at the stress points A can be selectively increased to serve as the crack resistance area. As depicted in FIG. 9A, the widths ($W_A$, $W_B$) of the conductive line trace 120 at the stress points A and B, which are measured in the direction perpendicular to the bending direction, may be longer than the width (W) of the conductive line trace 120 at the parts between the stress points A and B. The extra width at the stress points may make the conductive line trace 120 hold out longer before a complete disconnection occurs as the stress points.

It should be reminded that the length for the continuous portion of the insulation layer being aligned to the bending direction should be kept minimal. Accordingly, in some embodiments, the width of the conductive line trace 120 measured in the direction perpendicular to the tangent vector of the curvature at the stress points A ranges from about 2.5 um to about 8 um, more preferably, from about 3.5 um to about 6 um, more preferably from about 4.5 um to about 8.5 um, and more preferably at about 4.0 um.

The width of the conductive line trace 120 measured in the crack growth direction at the stress points B should also be maintained in the similar manner as the width of the conductive line trace 120 at the stress points A. As such, the width of the wire at the stress points B may range from about 2.5 um to about 8 um, more preferably, from about 3.5 um to about 6 um, more preferably from about 4.5 um to about 8.5 um, and more preferably at about 4.0 um. Due to the close proximity of the angled corners and their crack growth direction at the stress points B, the width of the conductive line trace 120 at the stress points B may be longer than width at the stress points A.

In order to minimize the chance of crack initiating from both the inner wire trace line 820 and the outer wire trace line 830, at least one side of the wire trace lines may not be as sharply angled as the other trace lines at the stress points A. In the embodiment depicted in FIG. 9A, the inner trace line 820 at the stress points A has the angled corner and the outer trace line 830 at the stress points A is substantially parallel (e.g., ±5°) to the bending direction. However, the length L of the outer trace line 830 extending in the bending direction in excess may defeat the purpose of utilizing the strain-reducing trace design in the first place. As such, the length L for the portion of the outer trace line 830 extending substantially parallel to the bending direction may be equal to or deviate slightly (e.g., within ±2.5 μm) from the width W of the wire trace.

Alternatively, the sharply angled corner can be formed with the outer trace line 830 while the inner trace line 820 at the stress points A being substantially parallel to the bending direction. In both cases, the less sharply angled trace line can simply be more rounded rather than being a straight line as shown in FIG. 9A.

Figure 9C:
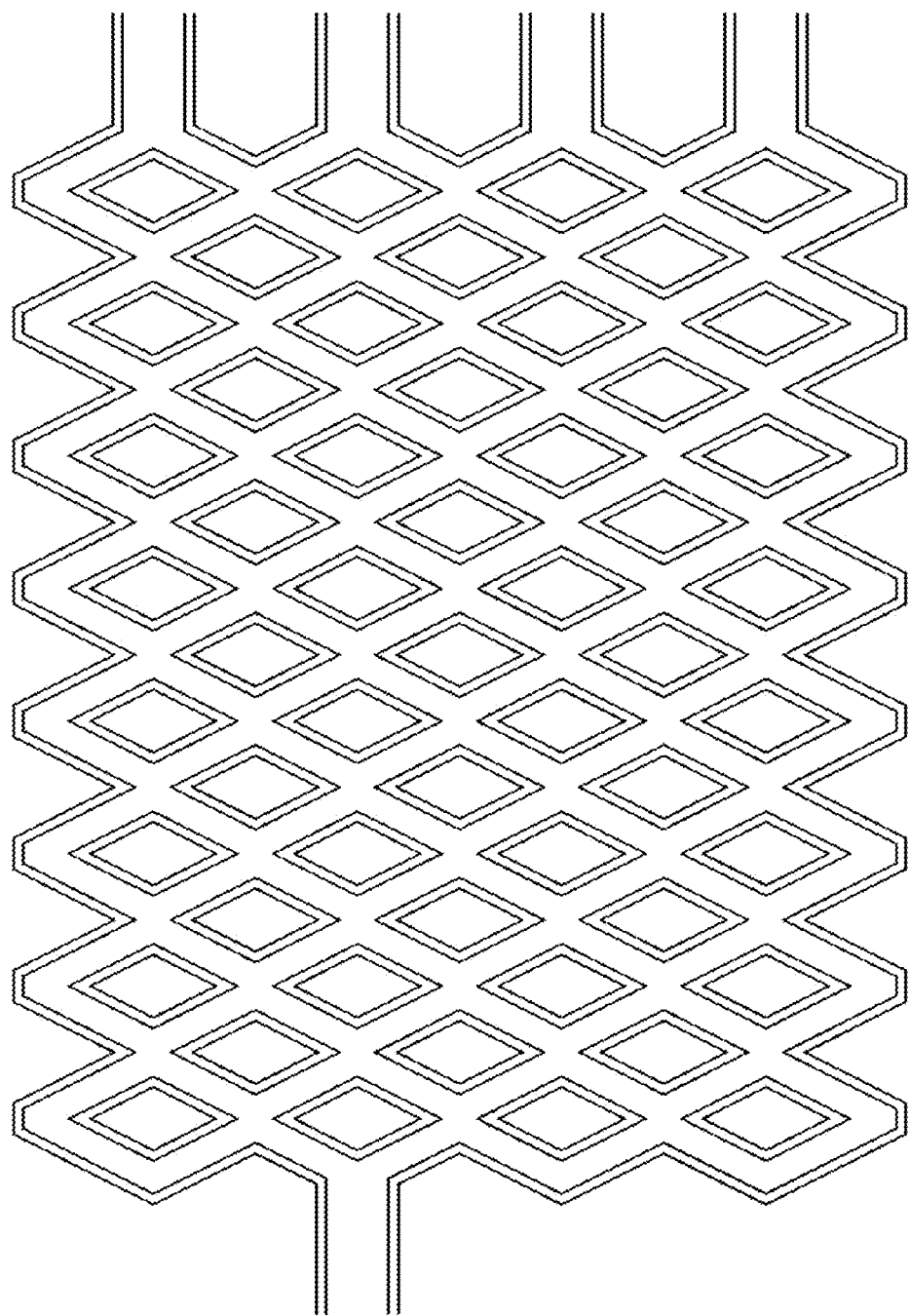

The wire trace may split into additional number of sub-traces, resulting in a grid-like wire trace in the flexible display 100. As an example, the sub-traces can be configured as a web of diamond trace shapes as illustrated in FIG. 9C. Such trace design is particularly useful for wire traces that transmit a common signal or require reduced electrical resistance. For example, wire traces for providing VSS and VDD in the flexible display 100 may have the grid-like trace design. Neither the number of sub-traces nor the shapes of the sub-traces of the grid-like trace design are particularly limited as the exemplary design depicted in FIG. 9C.

In some embodiments, the split sub-traces forming the grid-like wire trace can converge back into a single line wire trace or form the diamond trace shown in FIG. 9A. In some cases, the size of each diamond-shaped trace of a grid-like wire trace may be larger than the size of each diamond-shaped trace of a diamond-chain trace to reduce the resistance.

The strain-reducing trace designs discussed above may be used for all or parts of the conductive line trace 120. In some embodiments, the part of conductive line trace 120 in the bend portion of the flexible display 100 may adopt such a strain-reducing trace design. The parts of a conductive line trace 120 prior to or beyond the part with the strain-reducing trace design may have the same trace design. If desired, the strain-reducing trace designs may be applied to multiple parts of a conductive line trace 120.

Patterned Insulation Layer

As mentioned, it should be noted that cracks primarily initiate from the inorganic insulation layers. Accordingly, propagation of cracks can be suppressed by selectively removing inorganic insulation layers from the areas prone to cracks. To achieve this, one or more inorganic insulation layers and/or stack of insulation layers including a layer of inorganic material can be selectively etched away at various parts of the flexible display 100.

For example, the insulation layer under the conductive line trace 120 can be etched away. The insulation layer under the conductive line trace 120 may be the buffer layer 126, which may include one or more layers of inorganic material layers. The buffer layer 126 may be formed of one or more layers of a $SiN_x$ layer and a $SiO_2$ layer. In one suitable configuration, the buffer layer 126 may be formed of alternating stacks of a $SiN_x$ layer and a $SiO_2$ layer. The buffer layer 126 is disposed on the base layer 126, but under the TFT.

To facilitate easier bending of the flexible display 100, a part of the buffer layer 126 may etched away in the bend portion of the flexible display 100. Accordingly, the buffer layer 126 formed on the substantially flat portion of the base layer 106 may be thicker than the buffer layer 126 over the bend portion of the base layer 106. When the buffer layer 126 is formed in a stack of multiple sub-layers, the buffer layer 126 in the substantially flat portion of the flexible display 100 may include one or more additional sub-layers than the buffer layer in the bend portion of the flexible display 100.

For example, the buffer layer 126 in the substantially flat portion may include multiple stacks of a $SiN_x$ layer and a $SiO_2$ layer, and the buffer layer 126 in the bend portion includes a single stack of a $SiN_x$ layer and a $SiO_2$ layer. It is also possible to have only a single layer of either a $SiN_x$ layer or a $SiO_2$ layer in some part of the bend portion. In one suitable configuration, each $SiN_x$ layer and $SiO_2$ layer in the buffer layer 126 may have a thickness of about 1000 Å. As such, the thickness of the buffer layer 126 in the bend portion of the flexible display may range from about 100 Å to about 2000 Å.

In the substantially flat portion of the flexible display 100, additional layer of inorganic layer may be provided immediately below the semiconductor layer of the TFT, which may be referred to as the active buffer. In some embodiments, an inorganic layer, which is most closely positioned under the active layer of the TFT, may be much thicker than the individual inorganic layers of the buffer layer 126.

The buffer layer 126 in the bend allowance section may be etched even further to expose the base layer 106 while leaving the buffer layer 126 intact under the conductive line trace 120. In other words, a recessed area and a protruded area are provided in the bend portion of the flexible display 100. The protruded area includes the buffer layer 126 provided on the base layer 106, whereas the recessed area has the base layer 106 exposed without the buffer layer 126 disposed thereon.

Figure 10A:
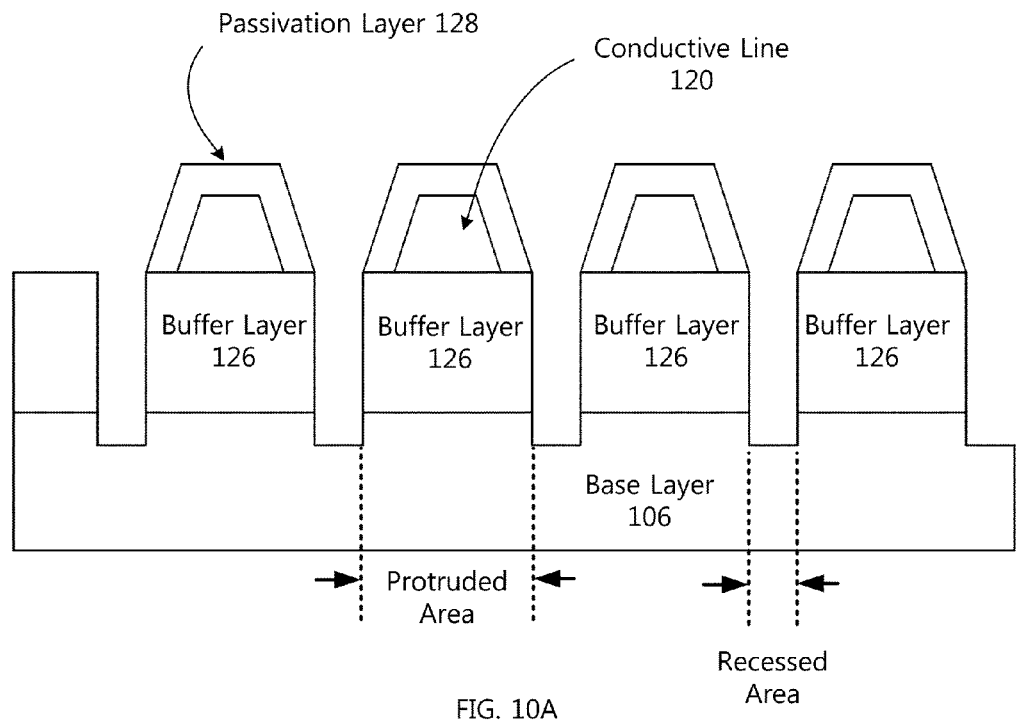
FIGS. 10A-10B cross-sectional view of exemplary configuration of insulations layers around a conductive line trace.

In one exemplary configuration shown in FIG. 10A, the conductive line trace 120 is positioned on the protruded area, and the passivation layer 128 is positioned over the conductive line trace 120 on the protruded area. Although the passivation layer 128 may be temporarily deposited over the recessed area, the passivation layer 128 can be removed from the recessed area by a dry etch or a wet etch process. As such, the recessed area can be substantially free of the passivation layer 128. When etching the passivation layer 128 from the recessed area, part of the base layer 106 can also be etched. Accordingly, the thickness of the base layer 106 at the recessed area can be lower than that of the base layer 106 elsewhere in the flexible display 100. When the buffer layer 126 is etched away as shown in FIG. 10A, propagation of crack from one part of the buffer 126 to another part of the buffer layer 126 can be hindered by the space in the recessed area. Similarly, propagation of cracks by the passivation layer 128 is also hindered by the space of the recessed area. Accordingly, damage to the conductive line trace 120 by propagation of cracks can be reduced.

Figure 10B:
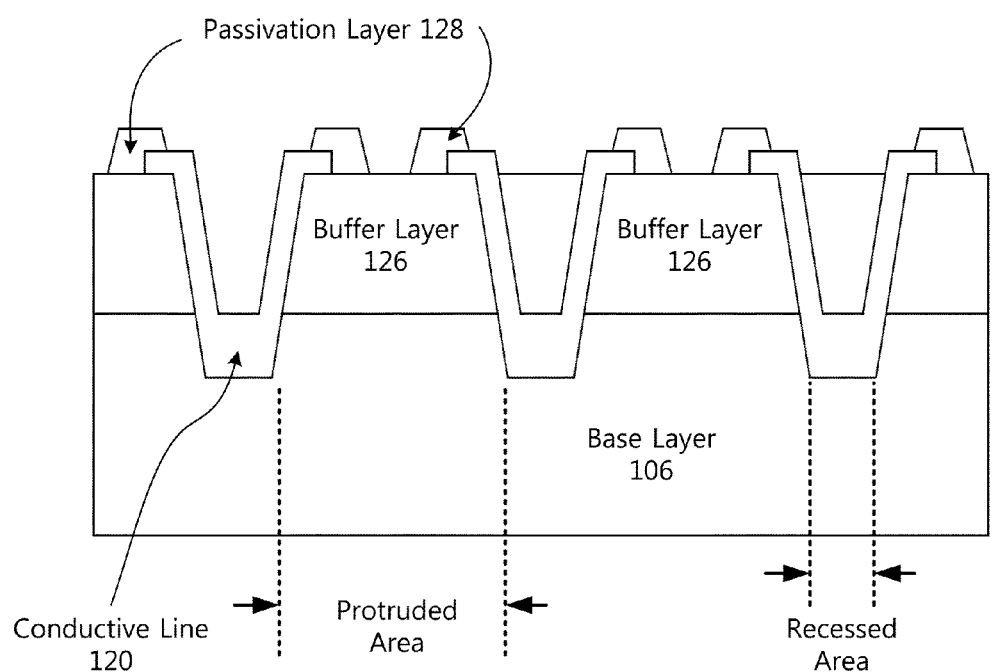

In another suitable configuration shown in FIG. 10B, the recessed area includes the base layer 106 that is etched to a certain depth, and the conductive line trace 120 is deposited on the base layer 106 of the recessed area. In this setting, the portion of the conductive line trace 120 is disposed within the base layer 106. Some part of the conductive line trace 120 is also deposited on a part of the buffer layer 126 that provides the protruded area. A passivation layer 128 can be deposited over the conductive line trace 120, and then etched away from the recessed area to expose the conductive line trace 120 in the recessed area.

Accordingly, the passivation layer 128 remains on the conductive line trace 120 positioned on the protruded area. In this configuration, the passivation layer 128 remaining on the buffer layer 126 can inhibit galvanic corrosion as it covers the cross-sectional side surface of the multi-layered conductive line trace 120. While cracks generated from the buffer layer 126 may penetrate to the conductive line trace 120 on the side surface of the buffer layer 126, but reaching the part of the conductive line trace 120 positioned within the base layer 106 will be difficult.

When the conductive line trace 120 has the multi-layered structure discussed above, the part of the conductive line trace 120 in the recessed area needs not be covered by the passivation layer 128. With the passivation layer 128 removed from the surface of the conductive line trace 120 in the recessed area, crack propagation from the passivation layer 128 can also be prevented. Further, galvanic corrosion generally starts from the edge of the conductive line trace 120 on the buffer layer, and thus the passivation layer 128 covering the edge of the conductive lines 120 on the buffer 126 may not be needed if the distance between the conductive line trace 120 on the buffer layer 126 and the conductive line trace 120 in the base layer 106 is sufficiently spaced apart from each other.

In some embodiments, the patterned insulation layer may also be applied in the routing area between the active area and the bend allowance section as well as the routing area between the COF bonding area and the bend allowance section.

Removal of inorganic insulation layers near the TFTs of the flexible display 100 may affect the electrical characteristic of components in the flexible display 100. For instance, undesired shift in the threshold voltage of TFTs may result when some part of the buffer layer 126 is removed. In order to maintain the stability of the TFTs, an additional shield metal layer can be formed under the semiconductor layer of the TFTs. The shield metal layer may be under the buffer layer 126 or interposed between the inorganic layers of the buffer layer 126. In some embodiments, the shield metal layer may be electrically connected to the source electrode or gate electrode of the TFTs.

As discussed above, some structural elements may not exist in some areas of the flexible display 100 to facilitate bending. For example, elements such as the touch sensor layer 112, polarization layer 110 and the like may be absent in the bend area of the flexible display 100. Also, some of the insulation layers, for instance the buffer layer 126, may be etched in some degree so that the insulation layer has less number of sub-layers or has a decreased thickness at one area as compared to other areas in the flexible display 100. Absence or simplification of these components and the layers would create a number of uneven surfaces where the wire trace may need to cross.

When a wire trace is laid over such an uneven surface, the plane level for parts the wire trace can be different. Being in a different plane level, the amount and direction of bending stress and the strain resulting from the bending stress can differ even among the parts of the wire trace. To accommodate the difference, a strain-reducing trace design for the wire traces can include a modified trace design for the portion of the wire trace on the uneven surfaces.

Figure 11A:
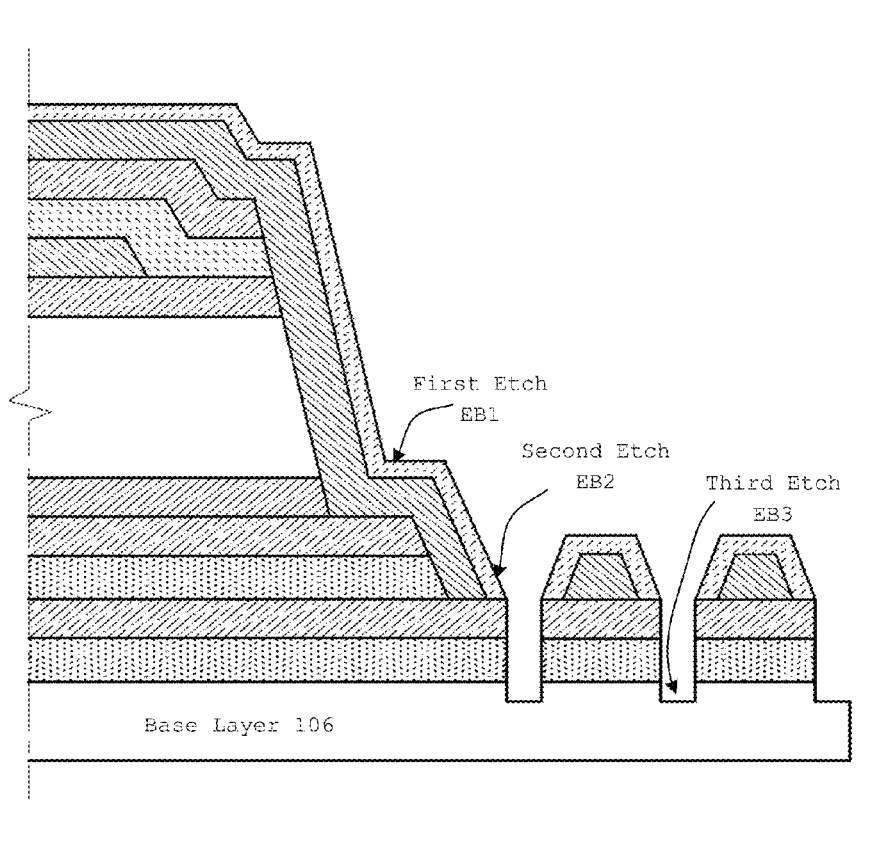
FIGS. 11A-11B illustrate schematic view of an exemplary strain-reducing wire trace design with modified portions adopted for crossing recessed areas of the flexible display according to embodiments of the present disclosure.

FIG. 11A is a enlarged cross-sectional view showing an exemplary backplane configuration for a flexible display 100, in which several insulation layers are removed from the bend portion to facilitate more reliable bending.

Several organic and inorganic layers may be formed in between the base layer 106 and the OLED element layer 102. In this particular example, alternating stacks of $SiN_x$ and $SiO_2$ layers can be disposed on the base layer 106 to serve as the buffer layer 126. The semiconductor layer of a TFT may be sandwiched by an active-buffer layer and a gate insulation layer that are formed of $SiO_2$ layer. The gate of the TFT is disposed on an interlayer dielectric layer (ILD), and the source/drain of the TFT having the multi-layered structure as discussed above is sandwiched between the ILD and a passivation layer. Here, the ILD may be formed of a stack of $SiN_x$ and $SiO_2$, and the passivation layer is formed of $SiN_x$. Then, a planarization layer is disposed over the passivation layer so that the anode for the OLED can be disposed thereon.

As mentioned above, use of the strain-reducing trace design is not just limited to the part of the wire traces within the bend portion. Also, the strain-reducing trace design can be applied to the part of the wire traces in the routing areas outside the bend allowance section. Using the strain-reducing trace design for the wire trace in such routing area can afford increased protection to the wire trace against the bending stress.

In the routing area, however, several layers of organic and/or inorganic material layers between the base layer 106 and the OLED element layer 102 may be absent to facilitate bending of the flexible display 100. Such organic and/or inorganic layers, including but not limited to the ILD, the gate insulation layer, buffer layer, passivation layer, planarization layer, etc. may not be present in the bend portion of the flexible display 100. Some of these layers may have been removed from the area by several etching processes. By way of example, several insulation layers on the buffer layer 126 may be etched by a first etch process, which is followed by the second etch process that etches away the active buffer and a part of the buffer 126 (e.g., a stack of a $SiN_x$ layer and a $SiO_2$ layer). These etching processes create multiple stepped regions as shown in FIG. 11A, with one or more of vertically sloped surfaces and horizontally leveled surfaces, where the wire trace is disposed thereon. The wire trace laid over the vertically sloped surfaces and horizontally leveled surfaces would have several bent spots, such as EB1 area and EB2 area.

When bending the flexible display 100 in the bending direction, the wire trace may experience more strain at or near the stepped region. Numerous tests and experiments indicate that the chance of a crack is especially high in the wire trace crossing over the stepped region between the EB1 area and the EB2 area. Accordingly, in some embodiments, the strain-reducing trace design for the wire trace has a reinforced portion at or near the stepped region between a high-leveled surface and a low-leveled surface provided by insulation layers of the flexible display.

Figure 11B:
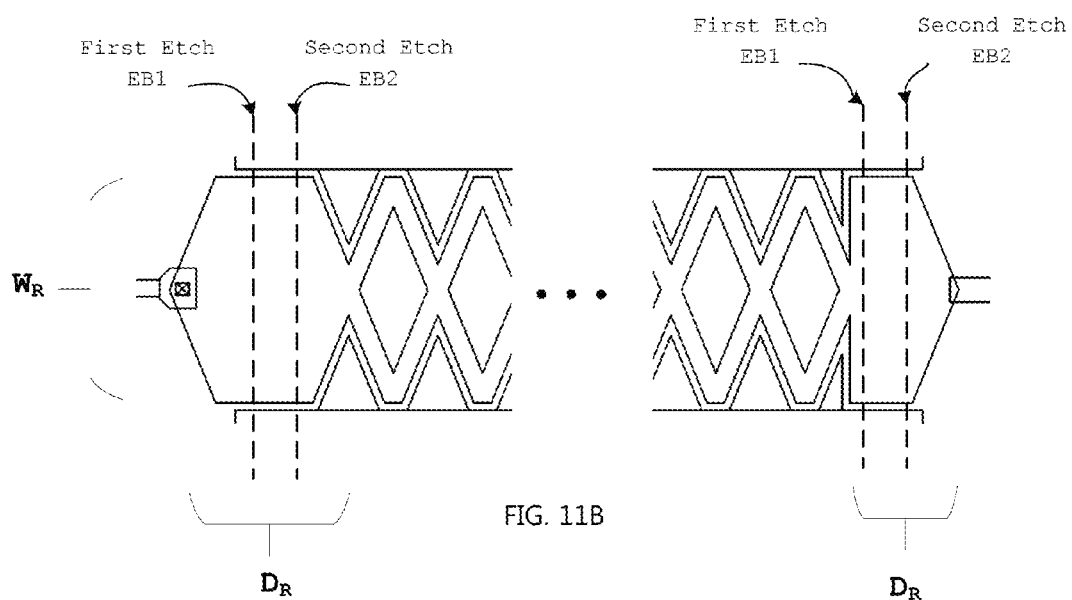

In the example shown in FIG. 11B, the wire trace has a simple straight line trace at its both ends. The part of the conductive line that crosses over before and after the bent spots EB1 and EB2 is reinforced with a modified trace design. At the modified portion, the conductive line is provided with a wider width extra width $W_R$ to ensure the perseveration of the conductive line trace 120 even if cracks initiate from the insulation layer near the bent spots EB1 and EB2. The distance $D_R$ of the reinforced portion of which the conductive line 120 is reinforced with the increased width $W_R$ depends on the size of the stepped region created by the etching processes as well as the distance between the first leveled surface (e.g., bent spot EB1) and a second leveled surface (e.g., bent spot EB2).

Past the modified portion (i.e., reinforced part), the wire trace is illustrated as having the strain-reducing trace design (i.e., diamond-chain trace design), which is previously described with FIG. 9A. However, the strain-reducing trace design of the wire trace applied with the modified portion is not limited to the strain-reducing trace design depicted in FIG. 11B. Various embodiments of the strain-reducing trace design can include a modified trace design for the portion of the wire trace corresponding to the stepped region between two differently leveled surfaces.

While this may not always be the case, the routing areas adjacent to the bend allowance section may be the substantially flat portions of the flexible display 100. In such cases, the bent spots EB1 and EB2 would be positioned at or just outside start of the bend allowance section in the bend portion.

The increased width $W_R$ of the reinforced conductive line trace 120 portion may serve its purpose well at or near the beginning and the end of the bend allowance section where the curvature is relatively small. The wider width $W_R$ of the wire trace and the length in which the modified trace portion is applied in the wire trace can increase the length of the wire trace that is linear to the bending direction. This would be make the wire trace harder to hold out against the bending stress at the region with greater bend radius.

For this reason, the distance $D_R$ in which the reinforced portion is should be limited such that the reinforced conductive line portion does not extend too much toward the bend allowance section. In other words, the distance $D_R$ of the reinforced conductive line portion may be limited such that the trace design of the reinforced conductive line portion does not extend beyond the bend allowance section with more than a threshold bend angle. In way of an example, the reinforced conductive line portion may not extend beyond the point where it is 30° curved away from the tangent plane of the curvature. The threshold bend angle may be less than 20°, for example 10°, and more preferably less than 7°.

The wire trace having the reinforced section may extend across the bend allowance section and routed to pads for COF or other components of the flexible display 100. In such instances, there may be additional stepped region (similar to EB1 and EB2) at or near the opposite end of the bend allowance section. The conductive line at or near such bent spots may be reinforced in the similar manner as the modified portion of the wire trace at the opposite end as shown in FIG. 11B. If desired, the reinforced conductive line portion at or near the stepped regions at the opposite ends of the bend allowance section may have a different shape as depicted in FIG. 11B.

Areas near the scribing line and/or chamfering line of the flexible display 100 may be another vulnerable spots. For instance, crack can initiate from the insulation layers during scribing the flexible display or chamfering a portion of the base layer 106. The cracks generated at the far end of the flexible display 100 can propagate towards central portion. The cracks from the chamfering line of the flexible display 100 may propagate into the bending area and the routing areas adjacent to the bending area. In some cases, cracks at the edges of the side inactive areas can propagate toward the active area and damage various circuits in the inactive areas, such as the GIP.

Accordingly, a selective areas along one or more scribing lines of the flexible display 100 may be substantially free of inorganic material layers. For example, areas at one or more edges of the base layer 106 in the flexible display 100, denoted as "the set-back area" in FIG. 12A, may be substantially free of the buffer layer 126. In the set-back areas, the base layer 106 may be exposed or only a predetermined minimal thickness of the buffer layer 126 may remain. Although the set-back areas are marked at the top edge and the bottom edge of the flexible display 100 in FIG. 12A, the side of one or more edges where the set-back area is provided, the size and the shape of the set-back area is not particularly limited as the example shown in FIG. 12.

Several side crack stopper structures may also be provided in the area between the edge (i.e., scribed line/chamfered line) and the active area and a central portion of the flexible display 100. For instance, a recessed channel can be formed in the inactive area by etching the insulation layers as shown on the left side edge of the active area in FIG. 12A. In some embodiments, a dummy wire trace pattern may be disposed between a circuit positioned in the inactive area and the outer edge of the inactive area to change the direction of crack propagating toward the circuit. For example, a metal trace having a strain reduction pattern and insulation layer covering the metal trace can be formed between the GIP and the edge of the flexible display 100 as depicted in FIG. 9A (right side).

It should be noted that the recessed channel on the left side of the active area can also be provided on the right side of the active area. Likewise, the metal trace with the strain-reducing pattern provided on the right side of the inactive area can also be provided on the left side of the inactive area. In some embodiments, both the recessed channel and the metal trace having the strain-reducing pattern can be provided on both sides of the active area. In this configuration, the cracks propagating from the outer edge of the inactive area in the direction towards the GIP may change its course due to the angle of the diamond metal/insulation trace formed before the GIP.

Removal of the insulation layers can also be performed in the routing area between the active area and the bend allowance section as well as the routing area between the COF bonding area and the bend allowance section. Further, the inorganic material layers may be removed from the areas next to the chamfering lines (i.e., notched line) so that cracks do not propagate from the chamfering line side towards the conductive lines 120.

Figure 12A:
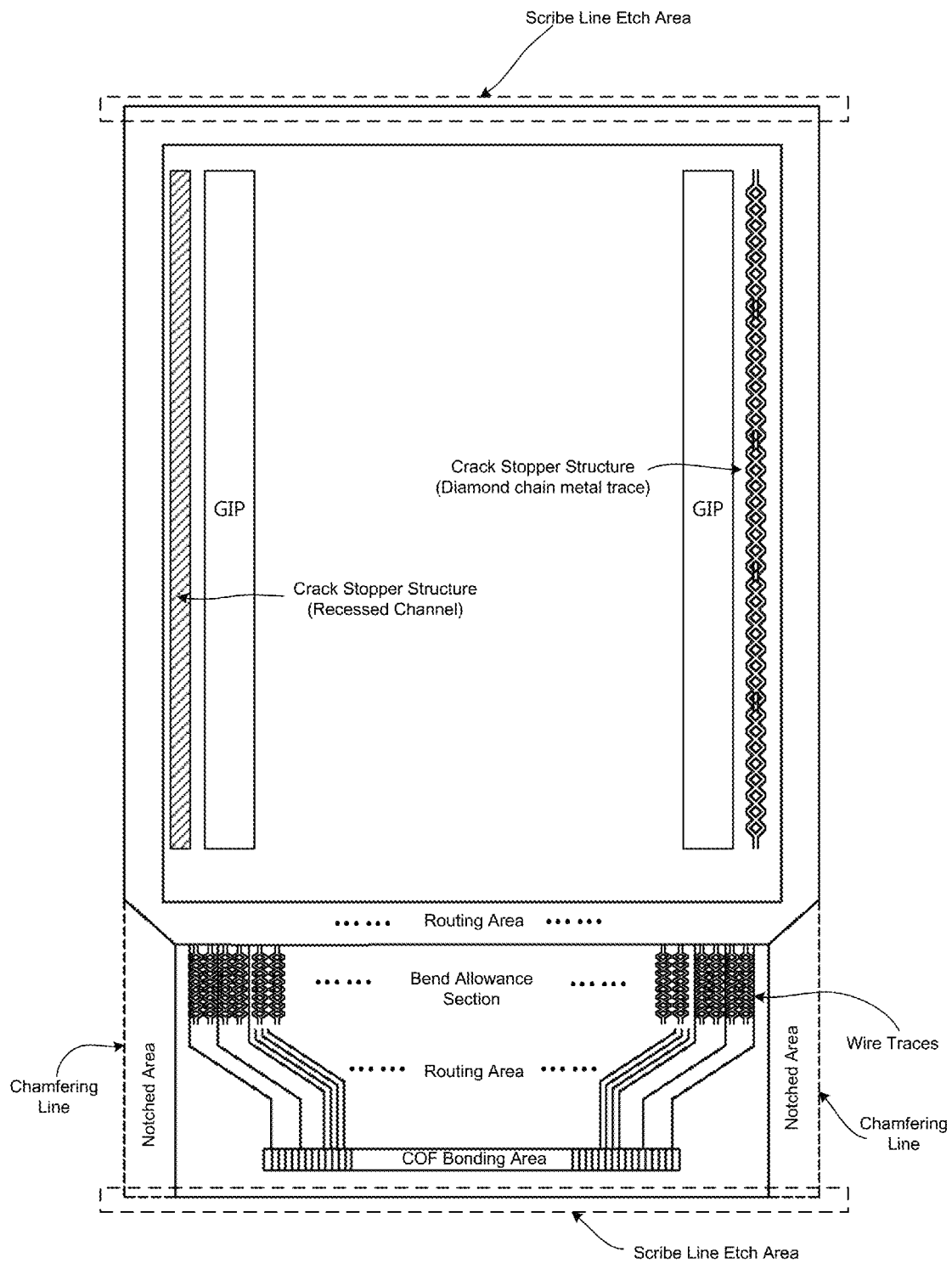
FIG. 12A illustrates schematic view of an exemplary configuration of recessed channel and crack deflection metal/insulation trace according to embodiments of the present disclosure.
Figure 12B:
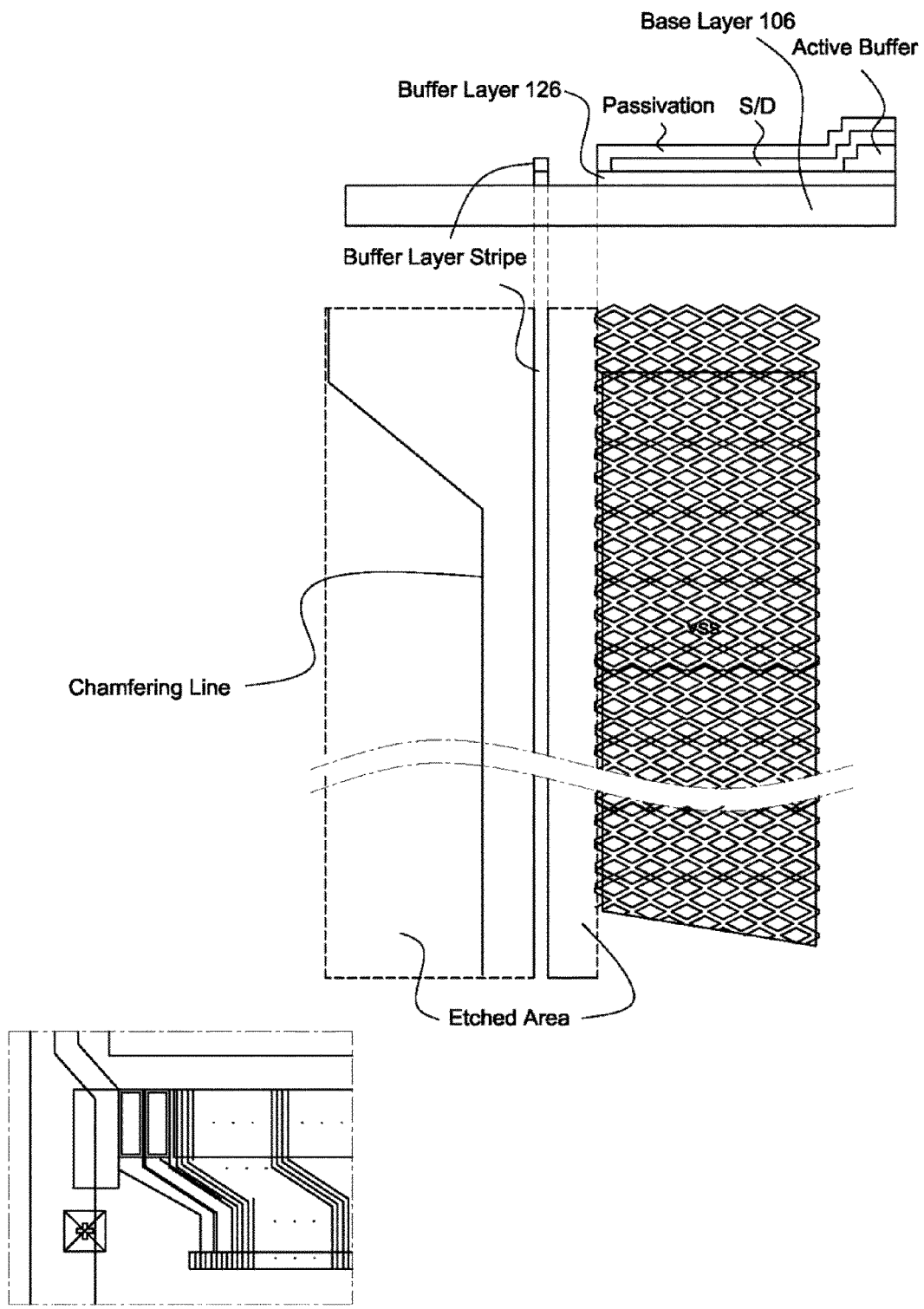
FIGS. 12B-12C illustrate schematic view of an exemplary configuration buffer etched area provided in between the notched line and the bend allowance section.

FIG. 12B is an enlarged view of the bend allowance section near the chamfering line (notched line). In order to reduce crack initiation and propagation from the inorganic layers near the chamfered line, the insulation layer is etched in the area between the wire trace (e.g., VSS line) to the chamfered line. In particular, the buffer layer 126 disposed on the base layer 106 in the area between the chamfered line and the conductive line 120 in the bend allowance section, which is closest to the chamfering line (e.g., VSS line) can be removed. In this area, the base layer 106 may be exposed or buffer layer 126 with a limited thickness (i.e., thinner than the buffer layer 126 under the conductive line trace 120) may remain. Accordingly, crack initiation and propagation from the chamfered line can be hindered by the buffer layer removed area.

As depicted in FIG. 12B, a stripe of buffer layer 126 may be left between the chamfering line and the closest conductive line trace 120 when etching the buffer layer 126 near the chamfering line. This stripe of buffer layer can serve as a dam for inhibiting moistures of other foreign material from reaching the conductive line trace 120 from the chamfered side of the flexible display 100.

The aforementioned buffer layer etched area can also be applied in the routing area between the chamfering line and the closest conductive line 120. The stripe of buffer layer 126 may also be provided in the routing area. Further, the buffer layer 126 under the conductive lines 120 and the passivation layer 128 on the conductive lines 120 can be patterned to correspond to the trace of the conductive lines 120 throughout the routing area to further reduce the chance of crack propagation by the inorganic insulation layers in the routing area. For instance, the structure depicted in FIGS. 10A and 10B may also be applied to the conductive line traces 120 in the routing area.

Figure 12C:
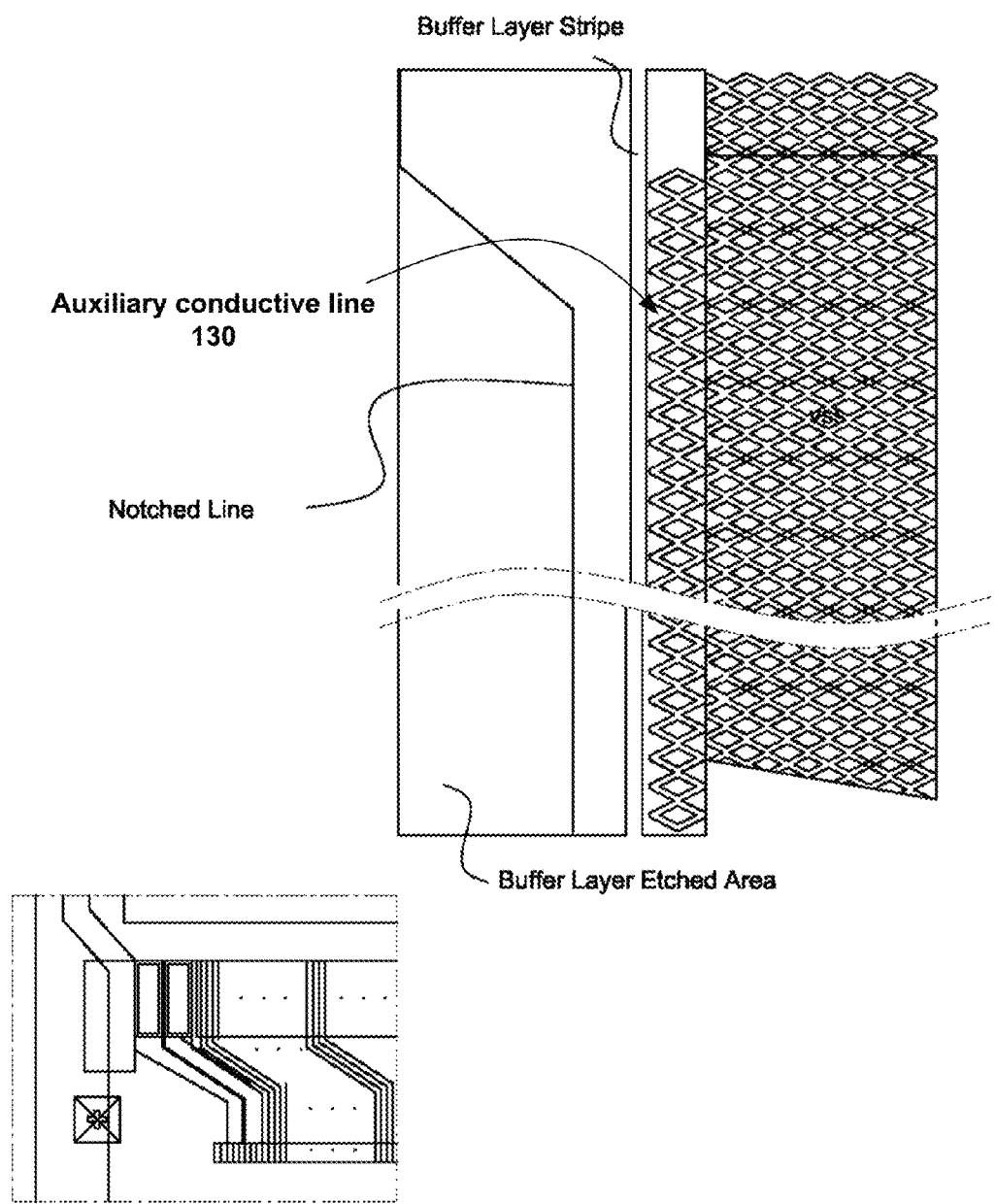

FIG. 12C is an enlarged view of the bend allowance section near the chamfering line provided with another type of crack stopper structure. In this embodiment, an auxiliary conductive line 130 having the diamond trace pattern is provided between the chamfering line and the conductive line trace 120 (e.g., VSS). The buffer layer 126 under the auxiliary conductive line 130 and the passivation 128 on the auxiliary conductive line 130 can be etched in the similar manner as depicted in FIGS. 10A and 10B. Accordingly, the auxiliary conductive line 130 may inhibit propagation of cracks from the chamfering line to the conductive line trace 120. The auxiliary conductive line 130 may be a floating line. If desired, the auxiliary conductive line 130 may extend outside the routing area towards the bottom edge of the flexible display 100. In some embodiments, the auxiliary conductive line 130 may be in contact with adjacent conductive line 120. In addition to the auxiliary conductive line 130, the stripe of buffer layer 126 may also be provided to stop moisture or other foreign materials traveling towards the auxiliary conductive line 130.

MCL

With the inorganic insulation layers etched away from the bend portion of the flexible display 100, the wire traces in the bend portion can be vulnerable to moistures and other foreign materials. In particular, various pads and conductive lines for testing the components during manufacturing of the flexible display 100 may be chamfered, and this can leave conductive lines exiting at the notched edge of the flexible display 100. Such conductive lines can easily corrode by the moistures, and cause other nearby conductive line traces to corrode as well.

Accordingly, a protective coating layer, which may be referred to as a "micro-coating layer" can be provided over the wire traces in the bend portion to provide added protection against moistures and other foreign materials. In addition to having a good moisture resistance, the micro-coating layer should have sufficient flexibility so that it can be used in the bend portion of the flexible display 100. Further, the material of the micro-coating layer may be a curable material with low energy within a limited time so that the components under the micro-coating layer are not damaged during the curing process.

FIG. 12A is a schematic illustration of one suitable exemplary configuration of the micro-coating layer 132 in an embodiment of flexible display 100. The micro-coating layer 132 may be provided as photo-curable (e.g., UV light, Visible light, UV LED) resin and coated over the desired areas of the flexible display 100. In this regard, the micro-coating layer 132 is coated over the area between the encapsulation 114 and the COF 134 attached in the inactive area. Depending on the adhesive property of the micro-coating layer 132, however, the micro-coating layer 132 can be detached from the encapsulation 114 and/or the COF 134. Any open space between the micro-coating layer 132 and the encapsulation 114 or the COF 132 may become a defect site where moisture can permeate through.

Accordingly, the micro-coating layer 132 may be coated to overflow into a part of the top surface of the encapsulation 114 for enhanced sealing between the encapsulation 114 and the micro-coating layer 132. The additional contact area between the micro-coating layer 132 and the surface of the encapsulation 114 can provide stronger bonding, and reduce the cracks and corrosion of the wire traces at the bend portion of the flexible display 100. Likewise, the micro-coating layer 132 can be coated on as least some part of the COF 134 for stronger bonding between the micro-coating layer 132 and the COF 134.

Figure 13A:
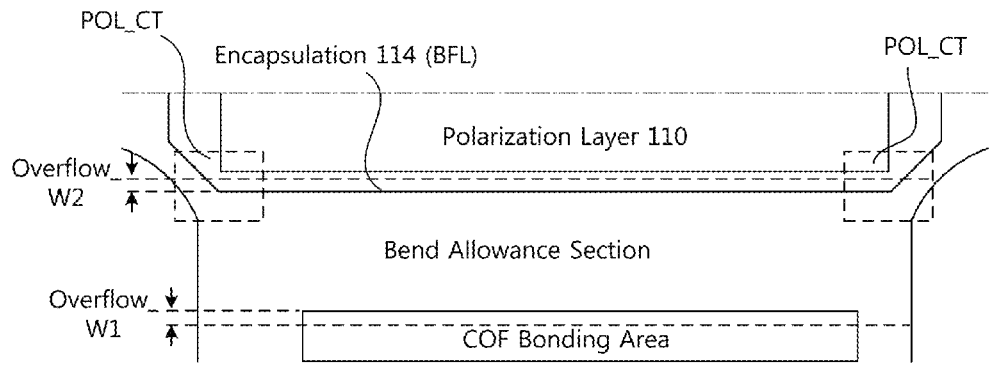
FIGS. 13A-13C illustrate schematic views of the flexible display provided with a micro-coating layer according to embodiments of the present disclosure.
Figure 13B:
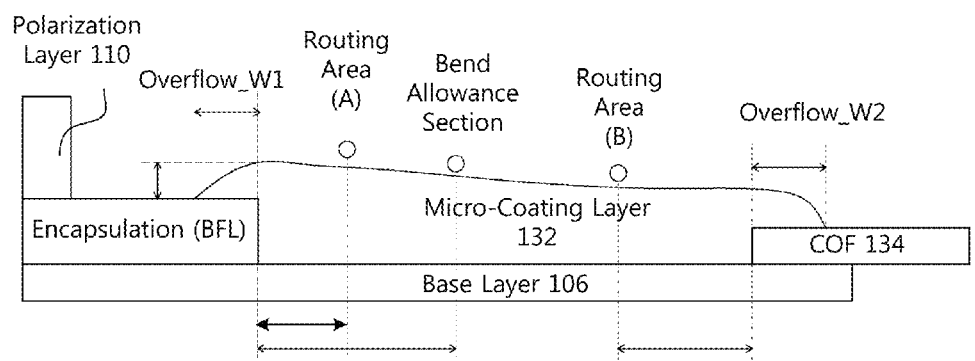
Figure 13C:
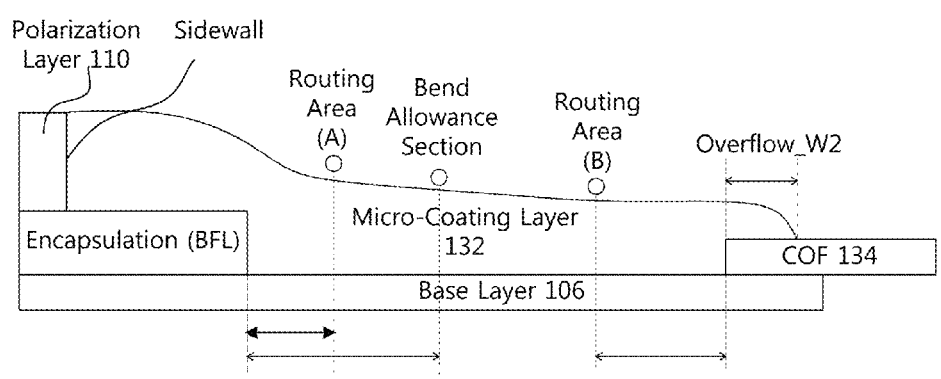

Referring to FIGS. 13B and 13C, the width of the encapsulation 114 coated with the micro-coating layer 134 (denoted as Overflow W1) and the width of the COF 134 coated with the micro-coating layer 134 (denoted as Overflow W2) are not particularly limited and may vary depending on the adhesiveness of the micro-coating layer 132. As shown in FIG. 13B, the flexible display 100 may include a portion where the micro-coating layer 132 on the encapsulation 114 is spaced apart from the sidewall of the polarization layer 110. In some embodiments, the flexible display 100 may include a portion where the micro-coating layer 132 on the encapsulation 114 is in contact with the polarization layer 110 disposed on the encapsulation 114 as depicted in FIG. 13C.

Figure 14A:
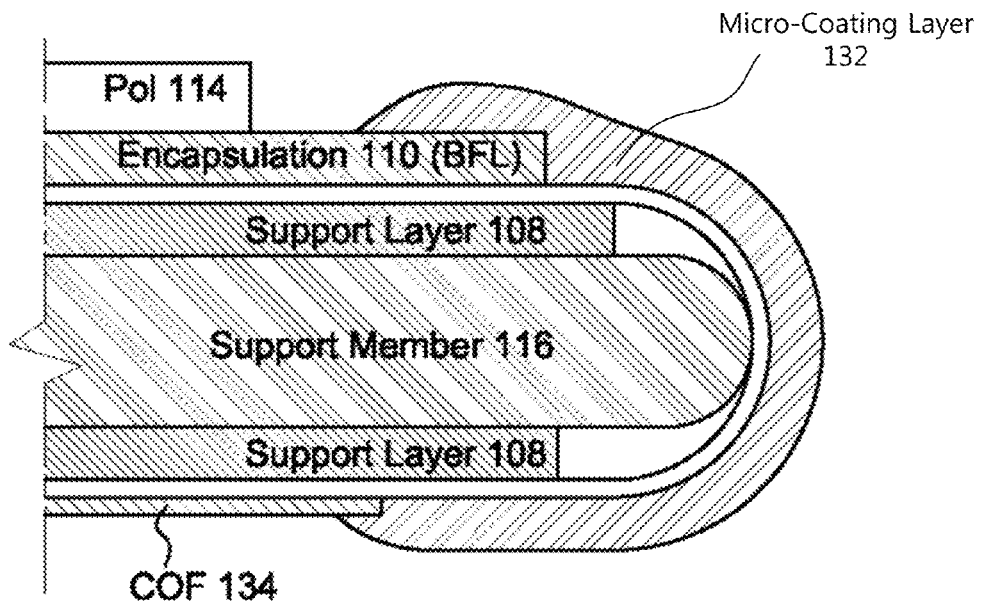
FIGS. 14A-14B illustrate schematic views of embodiments of the flexible display in a bent state, which are provided with a micro-coating layer according to embodiments of the present disclosure.
Figure 14B:
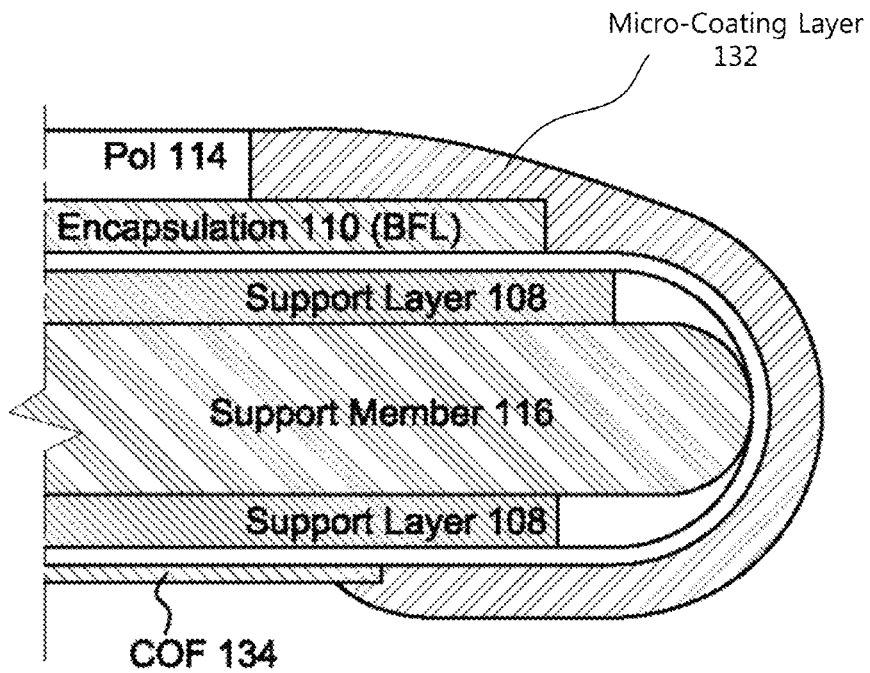

In one suitable configuration, the micro-coating layer 132 may be in contact with the polarization layer 110 at the two opposite corners (denoted "POL_CT") while the micro-coating layer 132 only covers up to some part of the encapsulation 114 in the areas between the two opposite corners. After the bending process, the part of the flexible display 100 where the micro-coating layer 132 is spaced apart from the polarization layer 110 may be configured as shown in FIG. 14A. In the region where micro-coating layer 132 is configured to be in contact with the polarization layer 110, the flexible display 100 may be configured as shown in FIG. 14B.

It should be noted that the micro-coating layer 132 is dispensed in a resinous form, and may spread on the dispensed surface. The spreading dynamic depends on the viscosity of the micro-coating layer 132 as well as the surface energy of which the micro-coating layer 132 is dispensed. As such, the micro-coating layer 132 overflowed into the encapsulation 114 may reach the polarization layer 110. When the micro-coating layer 132 reaches the sidewall of the polarization layer 114, the micro-coating layer 132 may climb over the sidewall of the polarization layer 110. Such sidewall wetting of the micro-coating layer 132 can make uneven edges over the surface of the polarization layer 132, which may cause various issues when placing another layer thereon. Accordingly, the amount of the micro-coating layer 134 dispensed on the targeted surface can be adjusted to control the width of the micro-coating layer 134 on the encapsulation layer 114.

The micro-coating layer 132 may be coated in a predetermined thickness to adjust the neutral plane of the flexible display 100 at the bend portion. More specifically, added thickness at the bend portion of the flexible display 100 by the micro-coating layer 132 can change the neutral plane so that the plane of the wire traces is shifted closer to the neutral plane.

In some embodiments, the thickness of the micro-coating layer 132 in the area between the encapsulation 114 and the COF 134, which is measured from the surface of the base layer 106, may be substantially the same as the distance between the surface of the base layer 106 to the top surface of the encapsulation 104. In such embodiments, the vertical distance between the top surface of the micro-coating layer 132 in the bend allowance section and the top surface of the encapsulation 114 may be less than 25 um.

Various resin dispensing methods, such as slit coating, jetting and the like, may be used to dispense the micro-coating layer 132 at the targeted surface. In way of an example, the micro-coating layer 132 can be dispensed by using a jetting valve. The dispensing speed from the jetting valve(s) may be adjusted during the coating process for accurate control of the thickness and the spread size of the micro-coating layer 132 at the targeted surface. Further, additional number of jetting values may be used to reduce the dispense time and limit the amount of spread before the micro-coating layer 132 is cured through UV irradiation.

Divided VSS-VDD Wire Trace

Spreading dynamic of the micro-coating layer 132 over the wire traces can be affected by the trace design of the wire traces. More specifically, patterning of the insulation layers along the wire trace in the bend portion of the flexible display 100 creates recessed areas and protruded areas, which essentially become a micro-grooved surface to be covered by the micro-coating layer 132.

When applying the strain-reducing trace design in the wire traces, patterning of the insulation layers around the split sub-traces creates the recessed open area, which is surrounded by the protruded stack of conductive line trace and the insulation layers under and over the conductive line trace. During coating of the micro-coating layer 132, some portion of the micro-coating layer droplet can permeate into the recessed open area. It can hinder the spreading and reduce the maximum spreading diameter of the micro-coating layer 132 on such a micro-grooved surface, and result in some part of the bend portion being exposed without the micro-coating layer 132.

Decrease in the wettability of micro-coating layer 132 by the distribution of the recessed areas and the protruded areas may be magnified even more in the area over the wire trace applied with the grid-like trace design shown in FIG. 9C. To counteract the viscid drag, in some embodiments, a wire trace, which includes multiple diamond-chain traces adjoined side-by-side, can be provided with a rail between two parts of the wire trace.

Figure 15:
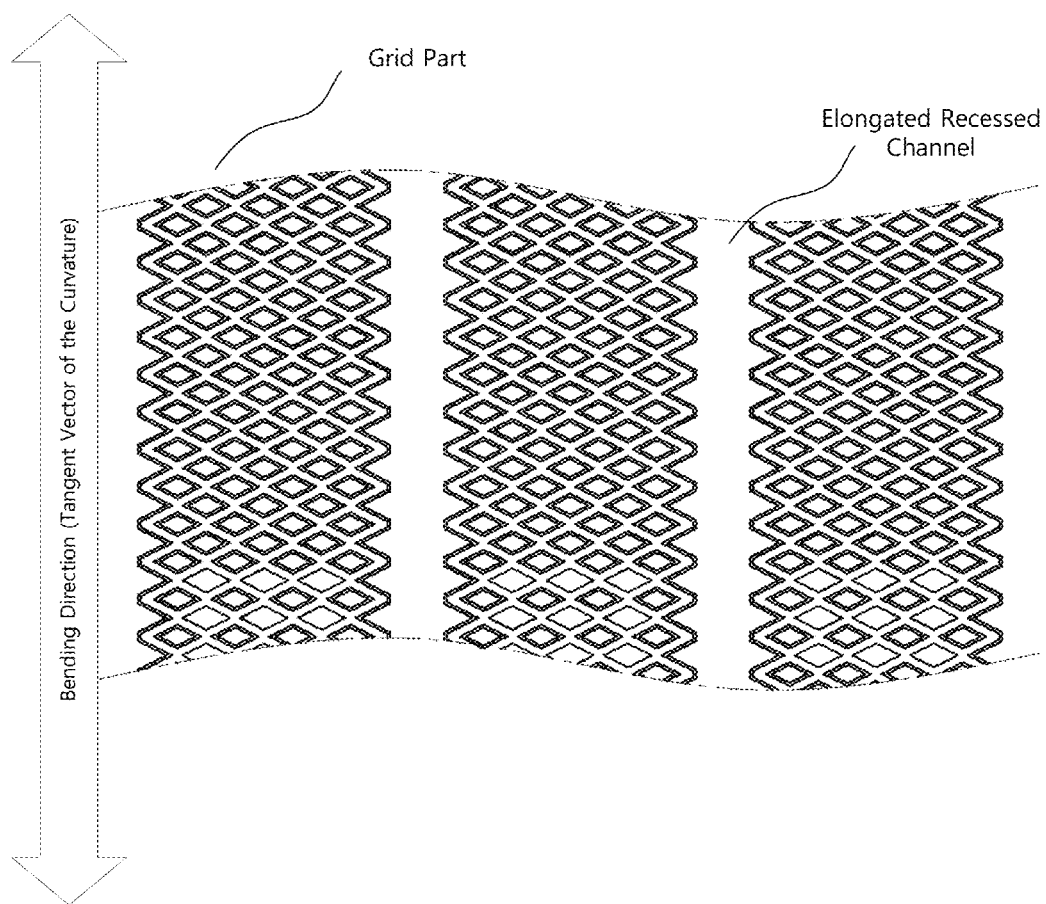
FIG. 15 illustrates a schematic view of an exemplary strain-reducing wire trace design provided with elongated recessed channel(s) for improving spread dynamics of a micro-coating layer.

Referring to FIG. 15, a wire with a grid-like trace strain-reducing trace design is provided with an elongated recessed channel. Within the elongated recessed channel, the conductive line trace 120 is not formed. Also, at least some of the inorganic insulation layers on the base layer 106 are removed in the elongated recessed channel. The elongated recessed channel between the parts of the wire trace extends from the signal supplying side to the signal receiving side of the wire trace. That is, the elongated recessed channel may extend in the direction substantially parallel to the bending direction. The part of the wire trace on one side of the elongated recessed channel is connected to the part of the wire trace on the opposite side of the elongated recessed channel, and thus both parts of the wire trace transmit the identical signal. The connection of the divided parts of the wire trace may be achieved at one or both ends of the wire trace by a conductive path, which may be a part of the wire trace. The connection of the divided parts of the wire trace may be achieved outside the bend allowance section.

Even though the parts of the wire trace on each side of the elongated recessed channel has the grid-like trace design, the reduced number of diamond-chain traces adjoined in each part can reduce the viscid drag of the micro-coating layer 132. More importantly, the elongated recessed channel between the parts of the wire trace serves as a channel, which improves the wettability of the micro-coating layer 132. In sum, increase in the maximum spread diameter of the micro-coating layer 132 can be achieved by positioning one or more rails within the wire having the grid-like strain-reducing trace design.

It should be noted that the resistance of the wire trace can increase with the elongated recessed channel dividing the wire into multiple parts. Increase in the resistance of the wire can raise the temperature of the wire trace when it is supplied with a signal. Accordingly, the number of elongated recessed channels provided in a single wire trace can depend on the signal transmitted via the wire trace. In some cases, the size of each diamond-shaped trace of a grid-like wire trace may be larger than the size of each diamond-shaped trace of a diamond-chain trace to reduce the resistance.

In one suitable configuration, one or more of power signal wires of the flexible display 100, such as the VDD and/or the VSS, has the grid-like wire trace formed of multiple diamond-chain traces adjoined side-by-side. The power signal wire includes a single elongated recessed channel between two divided grid parts on both sides of the elongated recessed channel, which are connected at the both ends of the power signal wire as depicted in FIG. 15. The size of the divided grid parts may be substantially the same. That is, the number of diamond-chain traces forming a gird part on one side of the elongated recessed channel may be the same as the number of diamond-chain traces forming a gird part on the opposite side. If desired, however, the number of diamond-chain traces adjoined to each other to form one grid part may differ from the number of diamond-chain forming another grid part.

In another suitable configuration, the power signal wire trace may include one elongated recessed channels, which divides the power signal wire trace into two grid parts connected at the start and the end of the wire trace.

Although the concepts and teachings in the present disclosure are described above with reference to OLED display technology, it should be understood that several features may be extensible to any form of flexible display technology, such as electrophoretic, liquid crystal, electrochromic, displays comprising discreet inorganic LED emitters on flexible substrates, electrofluidic, and electrokinetic displays, as well as any other suitable form of display technology.

As described above, a flexible display 100 may include a plurality of innovations configured to allow bending of a portion or portions to reduce apparent border size and/or utilize the side surface of an assembled flexible display 100.

In some embodiments, bending may be performed only in the bend portion and/or the bend allowance section having only the conductive line trace 120 rather than active display components or peripheral circuits. In some embodiments, the base layer 106 and/or other layers and substrates to be bent may be heated to promote bending without breakage, then cooled after the bending. In some embodiments, metals such as stainless steel with a passive dielectric layer may be used as the base layer 106 rather than the polymer materials discussed above. Optical markers may be used in several identification and aligning process steps to ensure appropriate bends absent breakage of sensitive components. Components of the flexible display 100 may be actively monitored during device assembly and bending operations to monitor damage to components and interconnections.

Constituent materials of conductive line trace 120 and/or insulation layers may be optimized to promote stretching and/or compressing rather than breaking within a bending area. Thickness of a conductive line trace 120 may be varied across a bending area and/or the bend allowance section to minimize stresses about the bend portion or the bend allowance section of the flexible display 100. Trace design of conductive line trace 120 and insulation layers may be angled away from the bending direction (i.e., tangent vector of the curvature), meandering, waving, or otherwise arranged to reduce possibility of severance during bending. The thickness of the conductive line trace 120, insulation layers and other components may be altered or optimized in the bend portion of the flexible display 100 to reduce breakage during bending. Bend stresses may be reduced by adding protective micro-coating layer(s) over components in addition to disclosed encapsulation layers. Conductive films may be applied to the conductive line trace 120 before, during, or after bending in a repair process. Furthermore, the constituent material and/or the structure for conductive line trace 120 in a substantially flat area of a flexible display 100 may differ from the conductive line trace 120 in a bend portion and/or the bend allowance section.

These various aspects, embodiments, implementations or features of the described embodiments can be used separately or in any combination. The foregoing is merely illustrative of the principles of this invention and various modifications can be made by those skilled in the art without departing from the scope of the invention.

What is claimed is:

1. A flexible display, comprising:
a substantially flat portion;
a bend portion that is curved away from a tangent plane of the substantially flat portion; and
a wire trace having at least three different trace designs, in which a first trace design is applied to a portion of the wire trace in the substantially flat portion, a second trace design is applied to a portion of the wire trace in the bend portion, and a third trace design is applied to a portion of the wire trace between the wire trace portions of the first trace design and of the second trace design,
wherein the second trace design is formed of a plurality of sub-traces that splits and merges at predetermined angles away from a tangent vector on the tangent plane, and
wherein the portion of the wire trace having the third trace design extends in an inclining or a declining direction from a first surface to a second surface.

2. The flexible display of claim 1, wherein the third trace design has a width that is greater than a width of the first trace design and widths of the sub-traces in the second trace design.

3. The flexible display of claim 1, wherein the third trace design includes a reinforced portion at a step created between the first surface and the second surface.

4. The flexible display of claim 1, wherein the reinforced portion starts on the first surface and ends on the second surface.

5. The flexible display of claim 1, wherein the first surface is a surface of a first insulation layer positioned above a semiconductor layer of a thin-film-transistor (TFT) and the second surface is a surface of a second insulation layer positioned below the semiconductor layer of the TFT.

6. The flexible display of claim 1, wherein the first surface and the second surface are surfaces of insulation layers positioned below a semiconductor layer of a thin-film-transistor (TFT).

7. The flexible display of claim 1, further comprising a base layer; and
an array of pixel circuits and a driving circuit on the base layer,
wherein the wire trace is connected to the array of pixel circuits or the driving circuit.

8. The flexible display of claim 7, wherein the wire trace includes a portion having a strain-reducing trace design.

9. The flexible display of claim 8, wherein the strain-reducing trace design is located on the base layer corresponding to the bend portion of the display apparatus.

10. The flexible display of claim 9, wherein one or more inorganic insulation layers disposed under or on the wire trace is patterned around the strain-reducing trace design.

11. The flexible display of claim 8, wherein the portion of the wire trace corresponding to the strain-reducing trace design includes an elongated recessed channel between a first grid part and a second grid part, which are in contact with each other.

12. The flexible display of claim 11, wherein each of the first grid part and the second grid part has a plurality of diamond-chain line traces that are arranged side-by-side and in contact to each other.

13. The flexible display of claim 12, wherein the elongated recessed channel extends in a direction substantially parallel to a bending direction.

14. The flexible display of claim 13, wherein the first grid part and the second grid part are connected to each other at one or both ends of the wire trace.

15. The flexible display of claim 13, wherein the portion of the wire trace corresponding to the strain-reducing trace design is on a bend allowance section, and wherein the first grid parts and the second grid parts are in contact to each other at outside the bend allowance section of the flexible display.

16. The flexible display of claim 15, wherein the portion of the wire trace corresponding to the strain-reducing trace design is covered by a micro coating layer.

17. The flexible display of claim 16, wherein the first grid part and the second grid part have the same size.

* * * * *